(12) United States Patent
Thimmegowda et al.

(10) Patent No.: US 12,120,878 B2
(45) Date of Patent: Oct. 15, 2024

(54) BLOCK-TO-BLOCK ISOLATION AND DEEP CONTACT USING PILLARS IN A MEMORY ARRAY

(71) Applicant: Intel NDTM US LLC, Santa Clara, CA (US)

(72) Inventors: Deepak Thimmegowda, Fremont, CA (US); Brian J. Cleereman, Boise, ID (US); Srivardhan Gowda, Boise, ID (US); Jui-Yen Lin, Hillsboro, OR (US); Liu Liu, Dalian (CN); Krishna Parat, Palo Alto, CA (US); Jong Sun Sel, Dalian (CN); Baosuo Zhou, Redwood, CA (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 17/791,176

(22) PCT Filed: Feb. 8, 2020

(86) PCT No.: PCT/CN2020/074565
§ 371 (c)(1),
(2) Date: Jul. 6, 2022

(87) PCT Pub. No.: WO2021/155611
PCT Pub. Date: Aug. 12, 2021

(65) Prior Publication Data
US 2023/0036595 A1    Feb. 2, 2023

(51) Int. Cl.
*G11C 16/08*     (2006.01)
*G11C 16/04*     (2006.01)
(Continued)

(52) U.S. Cl.
CPC ......... *H10B 43/27* (2023.02); *G11C 16/0466* (2013.01); *G11C 16/0483* (2013.01); *G11C 16/08* (2013.01); *H10B 43/50* (2023.02)

(58) Field of Classification Search
CPC ........ H10B 43/27; H10B 43/50; H10B 41/10; H10B 41/27; H10B 43/10; H10B 41/50;
(Continued)

(56) References Cited

U.S. PATENT DOCUMENTS 10,825,831 B1    11/2020 Koval et al.
2015/0194435 A1    7/2015 Lee
(Continued)

FOREIGN PATENT DOCUMENTS

| CN | 107545912 A | 1/2018 |
| CN | 109390350 A | 2/2019 |

(Continued)

OTHER PUBLICATIONS

International Search Report and Written Opinion for PCT Patent Application No. PCT/CN2020/074565, Mailed Oct. 28, 2020, 10 pages.
(Continued)

*Primary Examiner* — Mushfique Siddique
(74) *Attorney, Agent, or Firm* — Compass IP Law PC

(57) ABSTRACT

An integrated circuit memory includes a first memory block and an adjacent second memory block. The first memory block comprises a first memory pillar around which a first memory cell is formed. The second memory block comprises a second memory pillar around which a second
(Continued)

memory cell is formed. An isolation or slit area between the first and second memory blocks electrically isolates the first and second memory blocks. In an example, the slit area comprising a slit pillar around which no memory cells are formed. The slit pillar is a dummy pillar, and insulator material electrically isolates the slit pillar from a Word Line (WL) through which it passes. The isolation layer electrically can also isolate a (WL) of the first memory block from a corresponding WL of the second memory block. In an example, the slit pillar and the memory pillars have at least in part similar structures.

20 Claims, 11 Drawing Sheets

(51) Int. Cl.
*H10B 43/27* (2023.01)
*H10B 43/50* (2023.01)

(58) Field of Classification Search
CPC .. G11C 16/0466; G11C 16/0483; G11C 16/08
See application file for complete search history.

(56) References Cited

U.S. PATENT DOCUMENTS

| | | | |
|---|---|---|---|
| 2019/0107957 A1 | 4/2019 | Helmick et al. | |
| 2020/0266142 A1* | 8/2020 | Lee | H10B 41/40 |
| 2021/0125919 A1* | 4/2021 | Machkaoutsan | H01L 21/31111 |
| 2021/0193675 A1* | 6/2021 | Howder | H10B 43/27 |
| 2021/0217761 A1* | 7/2021 | Tiwari | H10B 41/27 |
| 2022/0028882 A1* | 1/2022 | Lee | H10B 43/27 |

FOREIGN PATENT DOCUMENTS

| | | |
|---|---|---|
| CN | 110310954 A | 10/2019 |
| CN | 209544352 U | 10/2019 |
| KR | 20190024579 A | 3/2019 |

OTHER PUBLICATIONS

Extended European Search Report for Patent Application No. 20917327.7, Mailed Sep. 8, 2023, 9 pages.

* cited by examiner

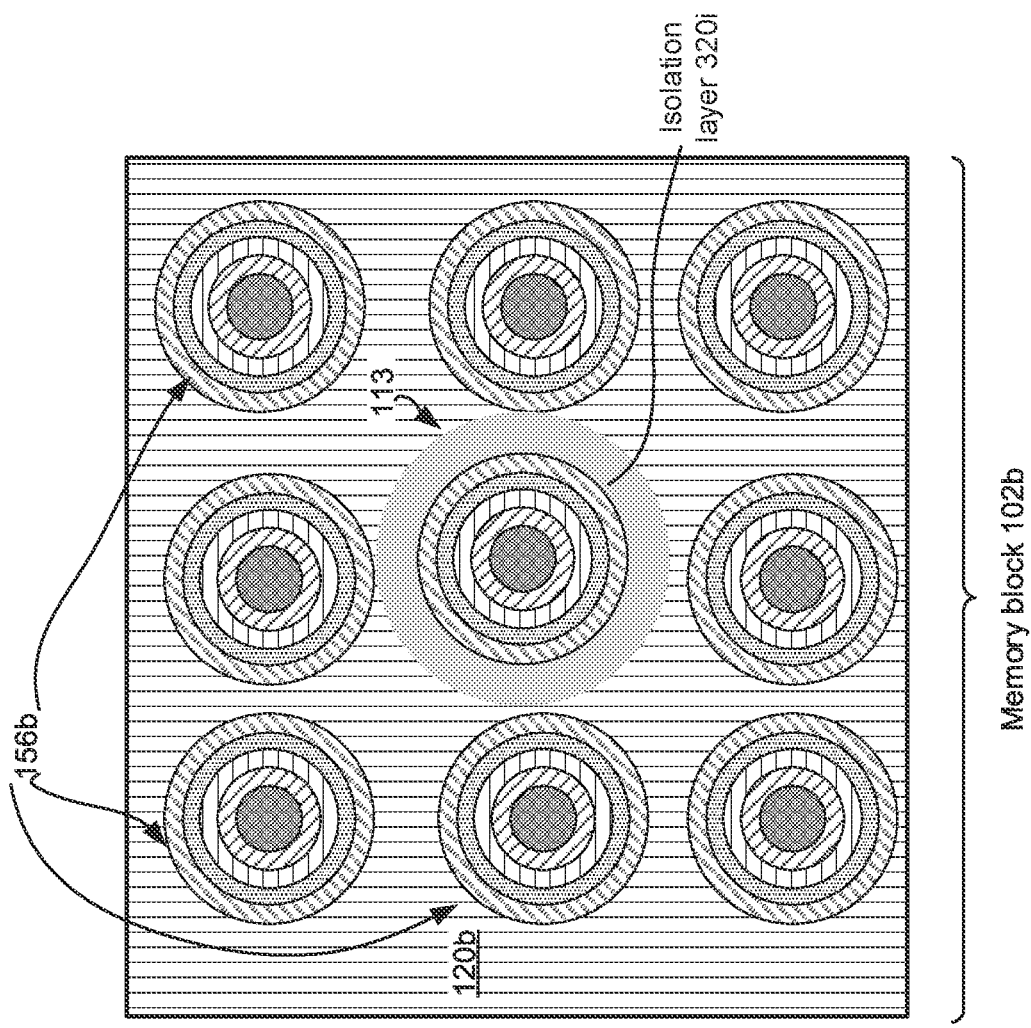

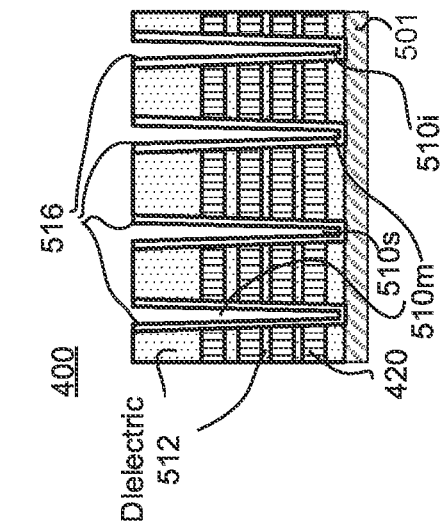
FIG. 4
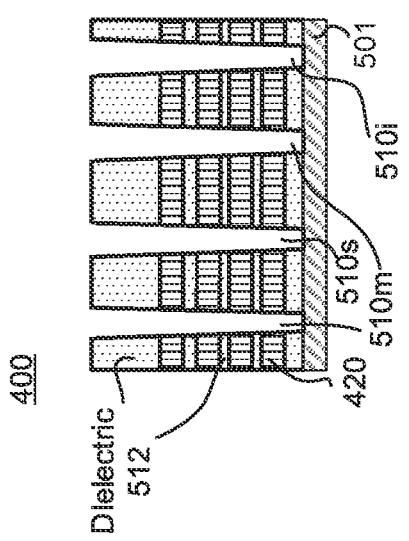
FIG. 5A
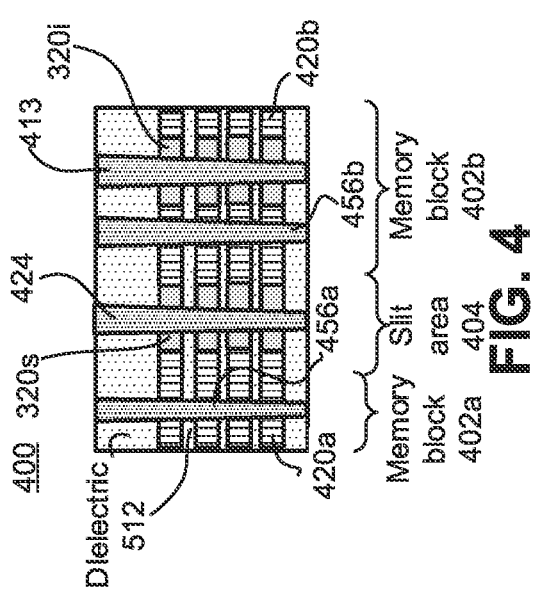
FIG. 5B
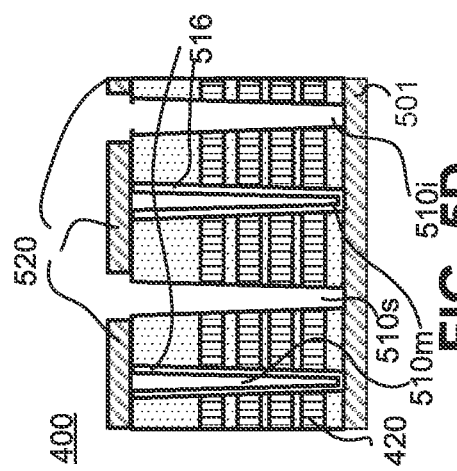
FIG. 5C
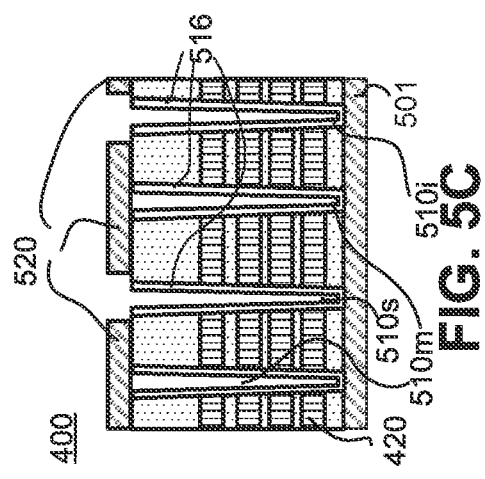
FIG. 5D
FIG. 5E

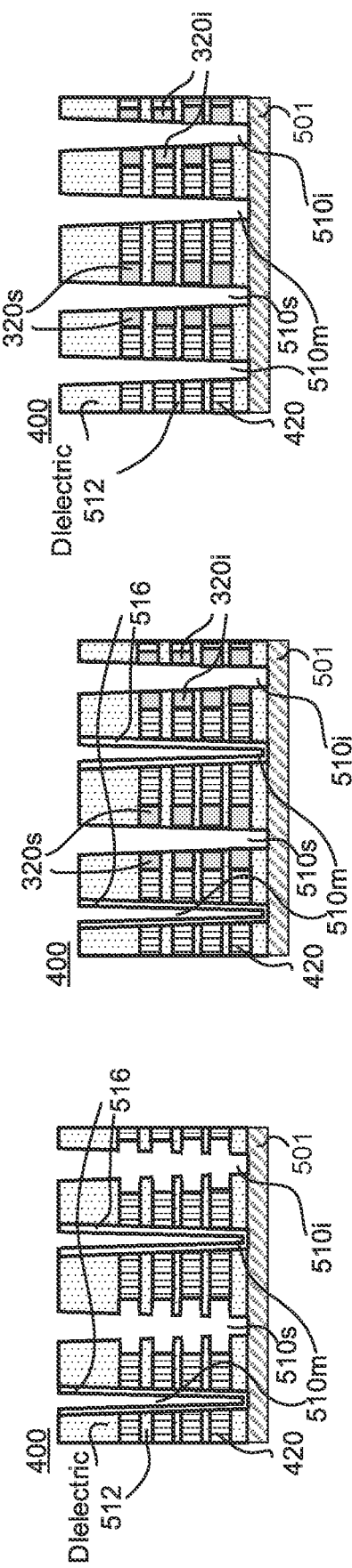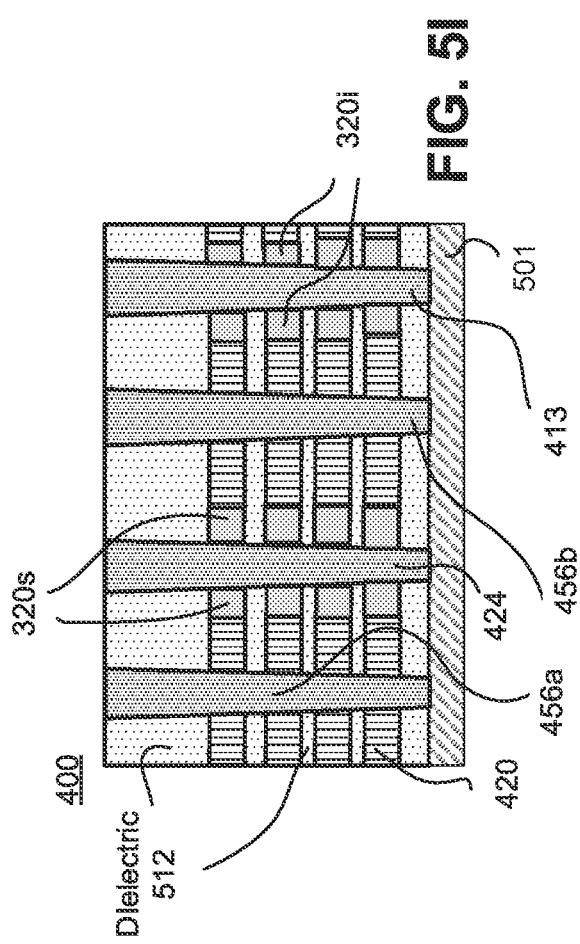

BLOCK-TO-BLOCK ISOLATION AND DEEP CONTACT USING PILLARS IN A MEMORY ARRAY

CLAIM OF PRIORITY

The present application is a national stage entry under 35 USC § 371(b) of International Application No. PCT/CN20/74565, filed Feb. 8, 2020, entitled "BLOCK-TO-BLOCK ISOLATION AND DEEP CONTACT USING PILLARS IN A MEMORY ARRAY," which is incorporated in its entirety herein.

BACKGROUND

Flash memory, such as NAND flash memory, is a non-volatile storage medium. A flash memory structure generally includes two or more memory blocks, where block-to-block separation is achieved with a slit area which electrically isolates adjacent memory blocks. Individual memory blocks include a plurality of laterally extending word lines (WLs), and vertical memory pillars extending through the WLs. A memory cell is formed at a junction of a corresponding memory pillar and a corresponding WL. The memory structure is usually accessed from the top, and logic circuitry is usually disposed underneath the WLs. In addition to memory pillars and slit areas, deep contacts or interconnect structures are used to connect metal above the array to metal below the array. As will be appreciated in light of this disclosure, there are a number of non-trivial issues with respect to forming distinct memory pillars, slit areas, and deep contacts, particularly as device scaling continues.

BRIEF DESCRIPTION OF THE DRAWINGS

FIG. 3E is a top-down or plane view of a memory structure illustrating a plurality of memory pillars and an interconnect pillar, in accordance with some embodiments of the present disclosure.

FIG. 4 illustrates a cross-sectional view of an integrated memory structure comprising a first memory block that includes a first memory pillar, a second memory block that includes a second memory pillar and an interconnect pillar, a slit area that includes a slit pillar between the first and second memory blocks, where the slit pillar and the interconnect pillar have structures that are at least in part similar to the structure of the first and second memory pillars, in accordance with some embodiments of the present disclosure.

FIGS. 5A, 5B, 5C, 5D, 5E, 5F, 5G, 5H, and 5I collectively illustrate a method for forming a memory structure such as the one shown in FIG. 4, in accordance with some embodiments of the present disclosure.

DETAILED DESCRIPTION

Figure 1A:
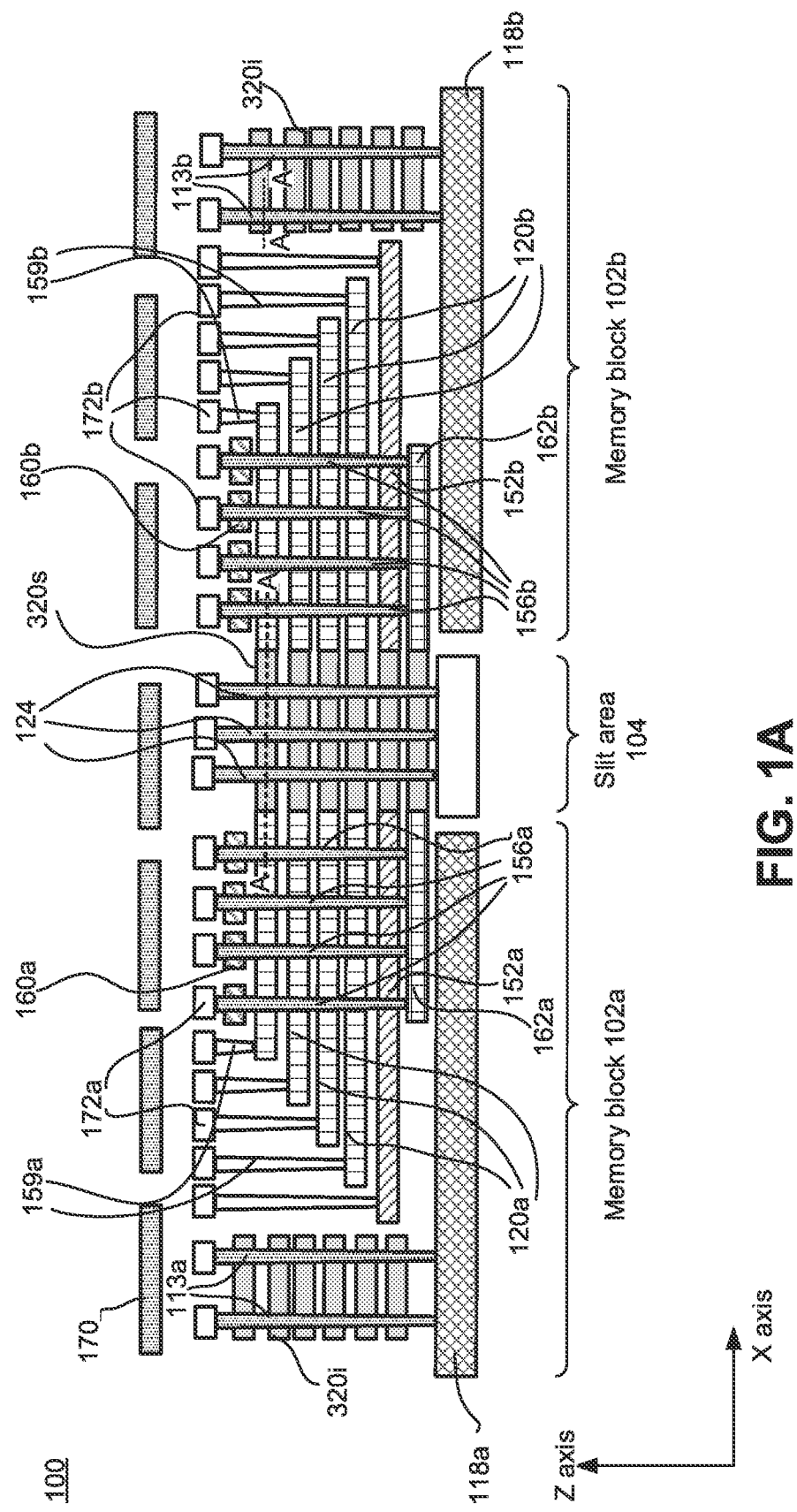
FIG. 1A illustrates a cross-sectional view of an integrated memory structure comprising a first memory block that includes first plurality of memory pillars, a second memory block that includes second plurality of memory pillars, and a slit area between the first and second memory blocks, wherein the slit area comprises a plurality of slit pillars that are at least in part similar to the memory pillars of the first and second memory blocks, in accordance with an embodiment of the present disclosure.

An integrated memory structure is disclosed herein, which includes at least a first memory block and an adjacent second memory block. The memory blocks can be, for example, NAND memory blocks, although other types of memory can benefit from the techniques provided herein as will be appreciated. Each memory block comprises one or more memory pillars extending through one or more Word Lines (WLs). Memory cells are formed at junctions of the memory pillars and the WLs. A slit area between the first and second memory blocks electrically isolates the two memory blocks. In some embodiments, the slit area comprises one or more dummy pillars, also referred to herein as slit pillars. In some such embodiments, one or more dummy pillars are also used for deep interconnect structures that electrically couple circuitries that are on top of the memory blocks to circuitries that are on bottom of the memory blocks—such dummy pillars are referred to herein as interconnect pillars. The slit pillars and the interconnect pillars are "dummy pillars" in the sense that they are structurally similar to the memory pillars except that no memory cells are formed around these pillars. In some embodiments, the slit pillars and the interconnect pillars extend through various tiers of the WLs. However, the slit pillars and the interconnect pillars are isolated from the WLs by isolation material formed around these pillars. The isolation material around the slit pillar also facilitates electrical isolation between a first section of the first memory block and a second section of the second memory block. This section-based isolation can be expanded with multiple such slit pillars to facilitate a larger area of electrical isolation between the two memory blocks in the slit area, up to complete isolation between those two memory blocks. Numerous variations and embodiments will be apparent in light of this disclosure.

General Overview

As previously noted, there are a number of non-trivial issues with respect to forming distinct memory pillars, slit areas, and deep contacts in 3D memory arrays. For instance, the slit area and/or the interconnect structures are formed separately from the memory pillars. In more detail, the memory pillars are typically formed first using one process, and are then masked off while forming the slit area and/or the interconnect structures. The processing is staged in this manner so that the formation of the slit area and/or the interconnect structures do not adversely impact the memory pillars. As scaling continues, the slit area width and/or the area reserved for the interconnect structures have to be increased, so ensure that the memory pillars are not adversely impacted. As the number of WL tiers increases, so too increases the area needed for slit and/or the interconnect structures. Such an increase in the slit area and/or the interconnect structure area result in less space available for the memory pillars. Thus, as it will be appreciated in light of this disclosure, it would be desirable to have memory structure designs that more efficiently utilize available die space.

To this end, various example embodiments of the present disclosure provide an integrated circuit memory structure that comprises memory pillars, slit pillars, and interconnect pillars, where the structures of the slit pillars and the interconnect pillars are at least in part similar to the structure of the memory pillars. In this manner, a similar process can be used to form the pillars. For example, a same process flow is used to form the memory pillars, the slit pillars, and the interconnect pillars, which significantly reduces the complexity associated with forming the slit area and the deep interconnect structures, as well as results in greater density of the memory pillars and reduction in die size, as will be discussed in further details herein. An outer isolation layer can later be selectively added to the slit pillars and interconnect pillars, rendering those pillars non-functional for memory cells but allowing them to be used for purposes of isolation and interconnection.

In an example embodiment, the integrated memory structure comprises two or more memory blocks. For example, the integrated memory structure includes a first memory block and a second memory block, which are separated by an intervening slit area. The slit area is to electrically isolate the two memory blocks. For example, in some such embodiments each of the first and second memory blocks comprise multiple tiers or levels of Word Lines (WLs). The WLs can be arranged in a staggered or staircase like arrangement as is sometimes done, so that each WL can be coupled to a corresponding WL contact structure. The memory pillars extend through the WLs. A memory cell is formed at a junction of a WL and a memory cell. Thus, as each memory block includes multiple WLs and multiple memory pillars, according to some embodiments, each memory block includes a plurality of corresponding memory cells.

The WLs of the memory structure are arranged at different horizontal planes. For example, a first WL of the first memory block and a first WL of the second memory block are arranged at a first horizontal plane. Similarly, a second WL of the first memory block and a second WL of the second memory block are arranged at a second horizontal plane that is substantially parallel to the first horizontal plane. A layer of intervening dielectric material separates the first and second WLs. A typical memory structure can include tens, or even hundreds of such levels or tiers of WLs.

The slit area comprises one or more slit pillars. The slit pillars are at least in part structurally similar to the memory pillars. For example, each of individual slit pillars and individual memory pillars comprise a pillar core, a dielectric layer around at least a section of the pillar core, a floating gate layer around at least a section of the dielectric layer, and two or more inter-poly dielectric (IPD) layers around at least a section of the floating gate layer. In addition, the pillar core includes non-conductive core material, and a layer of doped semiconductor material disposed around that core material (where the semiconductor material forms the channel of the memory pillar). In some such embodiments, the slit pillars and the memory pillars are formed using a same process flow.

However, unlike the memory pillars, no memory cells are formed around the slit pillars. Accordingly, the slit pillars are also referred to herein as "dummy pillars." Furthermore, unlike the memory pillars, a slit pillar includes isolation material arranged around a periphery of the slit pillar at one or more locations or levels along the vertical length of the slit pillar. For example, the slit pillar is a vertical pillar extending through the WLs. A first location or level of isolation layer is arranged in a first horizontal plane at a first height of the slit pillar, a second location or level of isolation layer is arranged in a second horizontal plane at a second height of the slit pillar, and so on.

The different levels of the isolation layers along the vertical length of the slit pillars correspond to the different tiers of the WLs. For example, and as will be further discussed in turn (such as with respect to FIG. 3A), the first WL is much like a sheet residing in a first horizontal plane. A first section of the sheet within the first memory block forms the first WL of the first memory block, and a second section of the sheet within the second memory block forms the first WL of the second memory block. In some such embodiments, a first level of isolation layers of the slit pillars of the slit area between the first and second memory blocks also resides at the first horizontal plane. The first level of isolation layers of slit pillars, in combination with one another, electrically isolates the first section of the sheet (i.e., the first WL of the first memory block) from the second section of the sheet (i.e., the first WL of the second memory block).

Similarly, a second WL is much like a second sheet residing in a second horizontal plane. A first section of the second sheet within the first memory block forms the second WL of the first memory block, and a second section of the second sheet within the second memory block forms the second WL of the second memory block. In some such embodiments, a second level of isolation layers of the slit pillars of the slit area between the first and second memory blocks also resides at the second horizontal plane. The second level of the isolation layers of the slit pillars, in combination with one another, electrically isolates the first section of the second sheet (i.e., the second WL of the first memory block) from the second section of the second sheet (i.e., the second WL of the second memory block).

Thus, the isolation material selectively provided along the vertical length of the slit pillars facilitates electrical isolation between adjacent WLs in the same plane of the memory structure. In some embodiments, the isolation levels of a slit pillar are formed by recessing sections of the WLs (e.g., polysilicon or other appropriately conductive material) adjacent to the slit pillar, and filling the relatively long recess of the WL with an appropriate electrical isolation material. The isolation material can be, for example, any appropriate dielectric and/or insulation material, such as an oxide, a nitride, a combination of oxide and nitride, or can even be a void (e.g., filled with air or other gas).

In some embodiments, in addition to forming the slit pillars, or alternatively, dummy pillars can also be used to form interconnect pillars. Interconnect pillars (also referred to herein as deep interconnect structures or simply interconnect structures) electrically couple one or more circuitries at a top section of a memory block to one or more circuitries at a bottom section of the memory block. For example, the bottom section of the memory block generally comprises logic circuitries, such as complementary metal-oxide-semiconductor (CMOS) logic. Such logic circuitries include logic components such as address decoders, state machines, buffers, word line drivers, bit line drivers, sense amplifiers, voltage dividers, charge pumps, digital logic blocks, logic gates, switches, inverters, adders, multipliers, and/or any other appropriate component of a memory block logic circuitry. The deep interconnect structures couple such logic circuitries to a top-level metallization of the memory block. These interconnect structures are relatively long (high aspect ratio of length to width such as 3-to-1 or 5-to-1 or higher, or otherwise deep), as they have to traverse from the top to the bottom of a memory block.

In some embodiments, interconnect pillars as variously provided herein are used to implement deep interconnect structures. Similar to the slit pillars, in an example, an interconnect pillar extends through the WLs. As discussed, interconnect pillars are also dummy pillars, as no memory cells are formed at junctions of an interconnect pillar and the WLs. For example, an interconnect pillar is electrically isolated from the WLs through which the interconnect pillar extends. In some embodiments, similar to the slit pillars, an interconnect pillar also comprises multiple levels of isolation layers or material along the vertical length of the interconnect pillar, where each level of the isolation layer electrically isolates the interconnect pillar from a corresponding sheet of a WL.

Similar to the slit pillars, in some embodiments, the interconnect pillars are also at least in part structurally similar to the memory pillars. For example, each of individual interconnect pillars and individual memory pillars comprise a pillar core, a dielectric layer around at least a section of the pillar core, a floating gate layer around at least a section of the dielectric layer, and two or more inter-poly dielectric (IPD) layers around at least a section of the floating gate layer. In addition, the pillar core includes a non-conductive core material, and a layer of doped semiconductor material disposed around that core material (where the semiconductor material forms the channel of the memory pillar, or the conductive portion of the interconnect pillar).

Thus, as discussed, in some embodiments, the slit pillars, the interconnect pillars, and the memory pillars have at least in part similar structure, except that slit pillars and interconnect pillars further include isolation material at locations along the vertical length of those pillars (to isolate the pillars from the WLs through which they pass). As discussed, the slit pillars and the interconnect pillars are dummy pillars, as these pillars are separated from the adjacent WLs by the isolation material. Hence, for the slit and interconnect pillars, no memory cells are formed in the junctions of between the WLs and the corresponding pillars. Hence, for the slit and interconnect pillars, the WLs cannot influence the electrical conduction of the doped semiconductor material disposed on the non-conductive core material of the pillar core. For example, in the interconnect pillar, the doped semiconductor material disposed on the non-conductive core material of the pillar core conducts current between the top-of-the memory block circuitry and the bottom-of-the memory block circuitry. In the slit pillar, the doped semiconductor material disposed on the non-conductive core material of the pillar core can also conduct current—but because the slit pillars are not coupled to any electrical circuitry, the slit pillars do not conduct current and are only used for electrical isolation between memory blocks. An interconnect pillar can be used if such conductivity is desired for signal routing purposes.

As noted, the slit pillars, the interconnect pillars, and the memory pillars beneficially can be formed using a same process flow. Using the same process flow significantly reduces the complexity associated with forming the slit area and the deep interconnect structures of the memory structure, relative to standard processing techniques.

Furthermore, as the same process flow can be used to form the slit pillars, the interconnect pillars, and the memory pillars, in an example, the slit and interconnect pillars need not be protected from the process flow of the memory pillars (or the memory pillars need not be protected from the process flow of the slit and interconnect pillars). Accordingly, the memory pillars of the memory structure can be densely arranged around the slit and interconnect pillars. This reduces space requirement for the slit area and the interconnect structures, and results in reduction in size of the memory structure. Numerous other benefits and variations will be apparent in light of this disclosure.

As discussed herein, terms referencing direction, such as upward, downward, vertical, horizontal, left, right, front, back, etc., are used for convenience to describe embodiments of integrated circuits having a base or substrate extending in a horizontal plane. Embodiments of the present disclosure are not limited by these directional references and it is contemplated that integrated circuits and device structures in accordance with the present disclosure can be used in any orientation.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items are included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Elements referred to herein with a common reference label followed by a particular number or alphabet may be collectively referred to by the reference label alone. For example, in FIG. 1A discussed herein later, memory blocks 102a, 102b may be collectively and generally referred to as memory blocks 102 in plural, and memory block 102 in singular.

Architectures

FIG. 1A illustrates a cross-sectional view of an integrated memory structure 100 (also referred to as a structure 100) comprising a first memory block 102a that includes first plurality of memory pillars 156a, a second memory block 102b that includes second plurality of memory pillars 156b, and a slit area 104 between the first and second memory blocks 102a, 102b, wherein the slit area 104 comprises a plurality of slit pillars 124 that are at least in part similar to the memory pillars 156a, 156b, in accordance with some embodiments of the present disclosure.

In an example, each of the memory blocks 102a, 102b comprises any appropriate three-dimensional (3D) memory array, such as a floating gate flash memory array, a charge-trap (e.g., replacement gate) flash memory array, a phase-change memory array, a resistive memory array, an ovonic memory array, a ferroelectric transistor random access memory (FeTRAM) array, a nanowire memory array, or any other 3D memory array. In one example, each of the memory blocks 102a, 102b is a stacked NAND flash memory array, which stacks multiple floating gate or charge-trap flash memory cells in a vertical stack wired in a NAND (not AND) fashion. In another example, the 3D memory arrays 102a, 102b include NOR (not OR) storage cells.

The memory block 102a comprises word lines (WLs) 120a, and the memory block 102b comprises WLs 120b. Although merely four tiers of WLs are illustrated for each of the memory blocks 102, the memory blocks 102 can have any appropriate number of tiers of WLs. The WLs 120 are staggered or arranged in a stair-case like pattern.

In some embodiments, the memory block 102a includes memory pillars 156a, and the memory block 104b includes memory pillars 156b. Although each memory block 102 is illustrated to include four corresponding memory pillars 156, each memory block 102 can have any other appropriate number of memory pillars, such as one, two, three, five, or higher. Individual charge storage device (e.g., memory cell, not illustrated) is formed at a corresponding junction of a corresponding WL and a corresponding memory pillar 156. Thus, a plurality of memory cells is formed in each of the memory blocks 102, in a plurality of locations defined by junctions of individual memory pillars and individual WLs.

In one example, a specific WL 120 couples a corresponding plurality of memory cells. For example, a plurality of memory cells, which are formed at the junctions of a specific WL 120a and the various memory pillars 156a, are coupled by the specific WL 120a. The charge storage devices or memory cells coupled by the same WL can be logically grouped into a memory page. In some embodiments, the WLs 120 comprise conductive material, such as tungsten, polysilicon, an appropriate metal, and/or any appropriate conductive material.

The WLs 120 are arranged in different horizontal planes. For example, a first WL of the memory block 102a and a corresponding first WL of the memory block 102b resides in a first horizontal plane and form a first tier of WL of the two memory blocks. Similarly, a second WL of the memory block 102a and a corresponding second WL of the memory block 102b resides in a second horizontal plane, and form a second tier of WL of the two memory blocks, and so on. In some embodiments, the horizontal planes in which the different WLs reside are substantially parallel. Thus, for the above example, the first horizontal plane and the second horizontal plane are parallel to each other.

Each memory block 102 comprises corresponding plurality of WL contact structures 159, where each WL contact structure is coupled to a corresponding WL. For example, the memory block 102a comprises corresponding WL contact structures 159a, and the memory block 102b comprises corresponding WL contact structures 159b. As the different WLs 120 are at different depths and arranged in a staggered or staircase like fashion, height of various WL contact structures 159a also correspondingly vary, as illustrated in FIG. 1A. For example, a top-level WL is coupled to a WL contact structure having a relatively short height, whereas a bottom-level WL is coupled to a WL contact structure having a relatively long height. A WL contact structure 159 couples a corresponding WL 120 to circuitries that are outside the memory blocks. Thus, a WL contact structure 159 provides external connection to a corresponding WL 120.

In some embodiments, each memory block 102 includes, or is coupled to, a corresponding logic circuitry 118. For example, a logic circuitry 118a is formed underneath the memory block 102a, and a logic circuitry 118b is formed underneath the memory block 102b. In some embodiments, each logic circuitry 118 comprises logic components such as address decoders, state machines, buffers, word line drivers, bit line drivers, sense amplifiers, voltage dividers, charge pumps, digital logic blocks, logic gates, switches, inverters, adders, multipliers, and/or any other appropriate component of a memory block logic circuitry. In an example, one or more of the logic components of the logic circuitry 118 include complementary metal-oxide-semiconductor (CMOS) logic. In an example, the logic circuitry 108 may also be referred to as "CMOS logic," "CMOS circuitry," and/or the like, due to presence of CMOS circuits within the logic circuitry 108.

Each memory block 102 further includes conductive access lines to enable access to the memory cells, such as bitlines 160, e.g., which are coming out of the page in FIG. 1A (e.g., perpendicular to a plane of the paper), select gate source (SGS) 152, and current common source (SRC, also referred to as a source plate) 162 located underneath the memory pillars 156.

In some embodiments, the memory structure 100 is accessed from a top surface of the memory structure 100. For example, the memory structure 100 comprises a plurality of interconnect structures 170 comprising one or more metallization levels. Interconnect terminals 172 couple the interconnect structures 170 to various access lines, such as WL contact structures 159 and bit lines 160 (although coupling between the metallization levels 170 and the various access lines are not illustrated in FIG. 1A for purposes of simplicity).

In an example, one or more interconnect structures 113a extend through the memory block 102a, e.g., to electrically couple the metallization levels 170 on the top of the memory block 102a to the logic circuitry 118a at the bottom of the memory block 102a. Similarly, one or more interconnect structures 113b extend through the memory block 102b, e.g., to electrically couple the metallization levels 170 on the top of the memory block 102b to the logic circuitry 118b at the bottom of the memory block 102b. The interconnect structures 113 can be used to transmit signals to and/or from the logic circuitry 118. These vertical interconnect structures 113 are also referred to as "deep contact" structures, as these interconnect structures 113 extend the entire memory block (e.g., extend from a top of a memory block to a bottom of the memory block).

In some embodiments, an interconnect structure 113 is formed using a corresponding pillar, which has a structure that is at least in part similar to a structure of the memory pillars 156, as will be discussed in further detail herein. The interconnect structures 113 are also generally referred to as pillars, or specifically as interconnect pillars.

In some embodiments, the slit area 104 separates the memory blocks 102a, 102b, and electrically isolates the two memory blocks. For example, the slit area 104 separates two WLs of the two memory blocks that belong to the same level or same horizontal plane. As will be discussed in further detail herein, in some embodiments, the slit area 104 comprises one or more slit pillars 124 that facilitate the electrical isolation between the WLs of the two memory blocks 102a, 102b. In some embodiments, the slit pillars 124 are structurally at least in part similar to the memory pillars 156, except for, for example, various levels of isolation layers that surround each slit pillar 124.

In some embodiments, a slit pillar 124 comprises (or is adjacent to) different horizontal levels or planes of isolation material 320s disposed along a periphery of the slit pillar 124. For example, a first level of the isolation material 320s is at a first horizontal plane, where a first WL of the memory block 102a and a corresponding first WL of the memory block 102b are also on the first horizontal plane. The first level of the isolation material 320s electrically isolates the first WL of the memory block 102a and the corresponding first WL of the memory block 102b.

Similarly, a second level of the isolation material 320s is at a second horizontal plane, where a second WL of the memory block 102a and a corresponding second WL of the memory block 102b are also on the second horizontal plane. The second level of the isolation material 320s electrically isolates the second WL of the memory block 102a and the corresponding second WL of the memory block 102b.

Thus, a total number of levels of the isolation material 320s is at least equal to, or greater than, a number of tiers of the WLs 120. As illustrated, in addition to isolating the WLs, in some embodiments, a level of the isolation material 320s can also isolate the SGS 152a of the memory block 102a from the SGS 152b of the memory block 102b. Similarly, in some embodiments, a level of the isolation material 320s can also isolate the SRC 162a of the memory block 102a from the SRC 162b of the memory block 102b.

The interconnect pillars 113 also include similar levels of isolation material 320i, as illustrated in FIG. 1A. In some embodiments, the isolation material 320i facilitates electrical isolation between the interconnect pillar 113 and any adjacent component.

Thus, as discussed, the memory structure 100 comprises memory pillars 156, slit pillars 124, and interconnect pillars 113, which are also referred to generally as pillars. As also discussed, in some embodiments, the pillars 156, 124, and 113 have at least in part similar structures. Memory cells are formed in the junction of the memory pillars 156 and the WLs 120, and hence, the memory pillars 156 are also referred to herein as "active pillars" of the memory structure 100. On the other hand, no memory cells are formed around the slit pillars 124 and/or interconnect pillars 113. Accordingly, the slit pillars 124 and interconnect pillars 113 are also referred to herein as "dummy pillars."

Figure 1B:
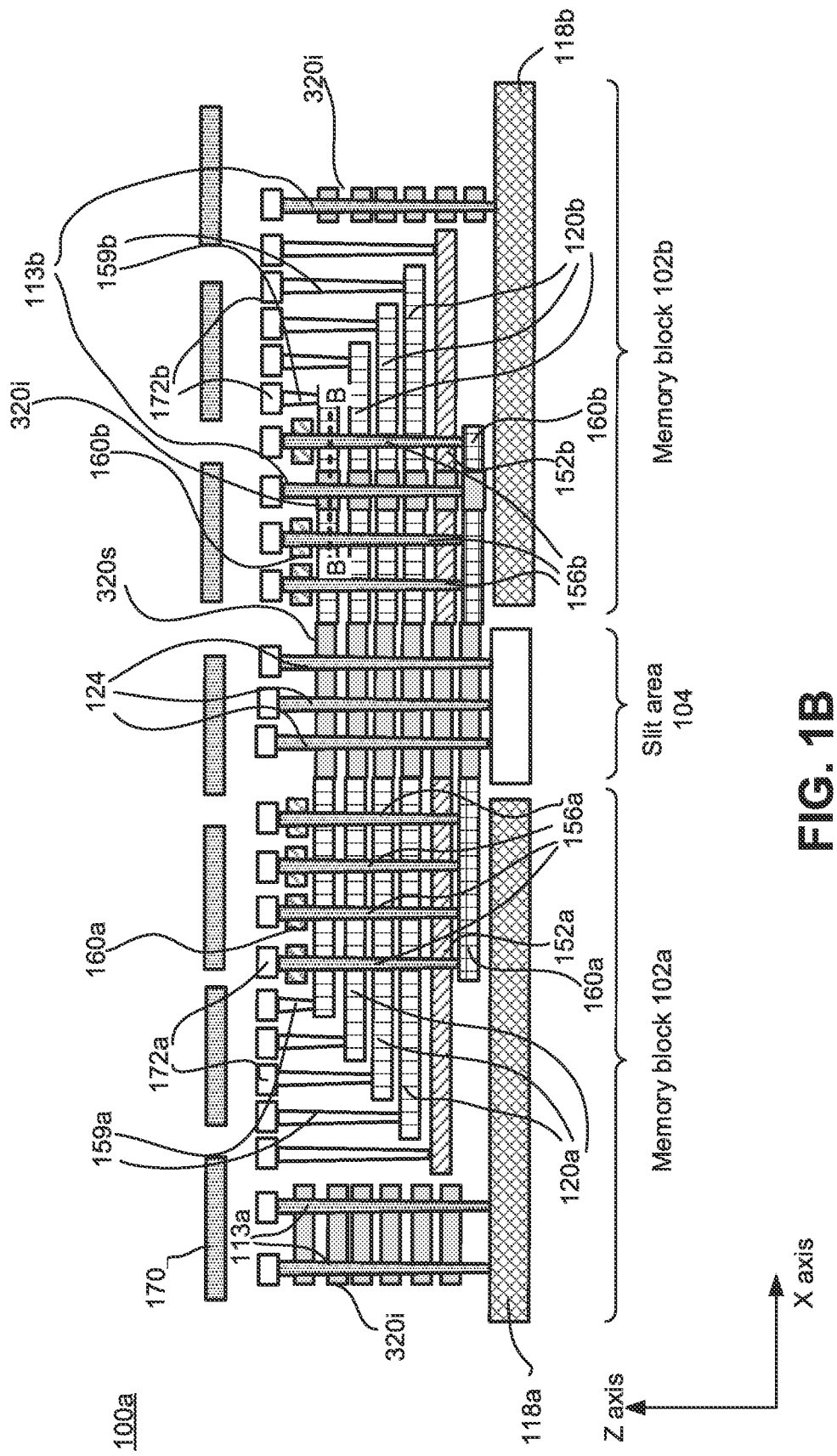
FIG. 1B illustrates a cross-sectional view of another integrated memory structure comprising a first memory block that includes first plurality of memory pillars, a second memory block that includes second plurality of memory pillars, a slit area between the first and second memory pillars, a slit area between the first and second memory blocks, and an interconnect pillar that extends through Word Lines (WLs) of the second memory block, in accordance with some such embodiments of the present disclosure.

FIG. 1B illustrates a cross-sectional view of another integrated memory structure 100a (also referred to as a structure 100a) comprising a first memory block 102a that includes first plurality of memory pillars 156a, a second memory block 102b that includes second plurality of memory pillars 156b, a slit area 104 between the first and second memory blocks 102a, 102b, and at least one interconnect pillar 113 that extends through WLs of the second memory block 102b, in accordance with some embodiments of the present disclosure. For example, as alluded to earlier with respect to FIG. 1 and as will be discussed in further details with respect to FIGS. 3A-3E, the isolation material 320i around an interconnect pillar 113 facilitates electrical isolation between the interconnect pillar 113 and any adjacent component. Thus, in FIG. 1B, at least one interconnect pillar 113b extends through the WLs 120b, and the isolation material 320i around the interconnect pillar 113b facilitates electrical isolation between the interconnect pillar 113 and the adjacent WLs 120b. The isolation material 320i comprises various horizontal levels. For example, a first level of the isolation material 320i in a first horizontal plane provides electrical isolation between the interconnect pillar 113 and a corresponding first WL 120b belonging to the same first horizontal plane. Similarly, a second level of the isolation material 320i in a second horizontal plane provides electrical isolation between the interconnect pillar 113 and a corresponding second WL 120b belonging to the same second horizontal plane, and so on, as illustrated in FIG. 1B. Various other components of the integrated memory structure 100a of FIG. 1B are similar to corresponding components of the integrated memory structure 100 of FIG. 1A.

Figure 2:
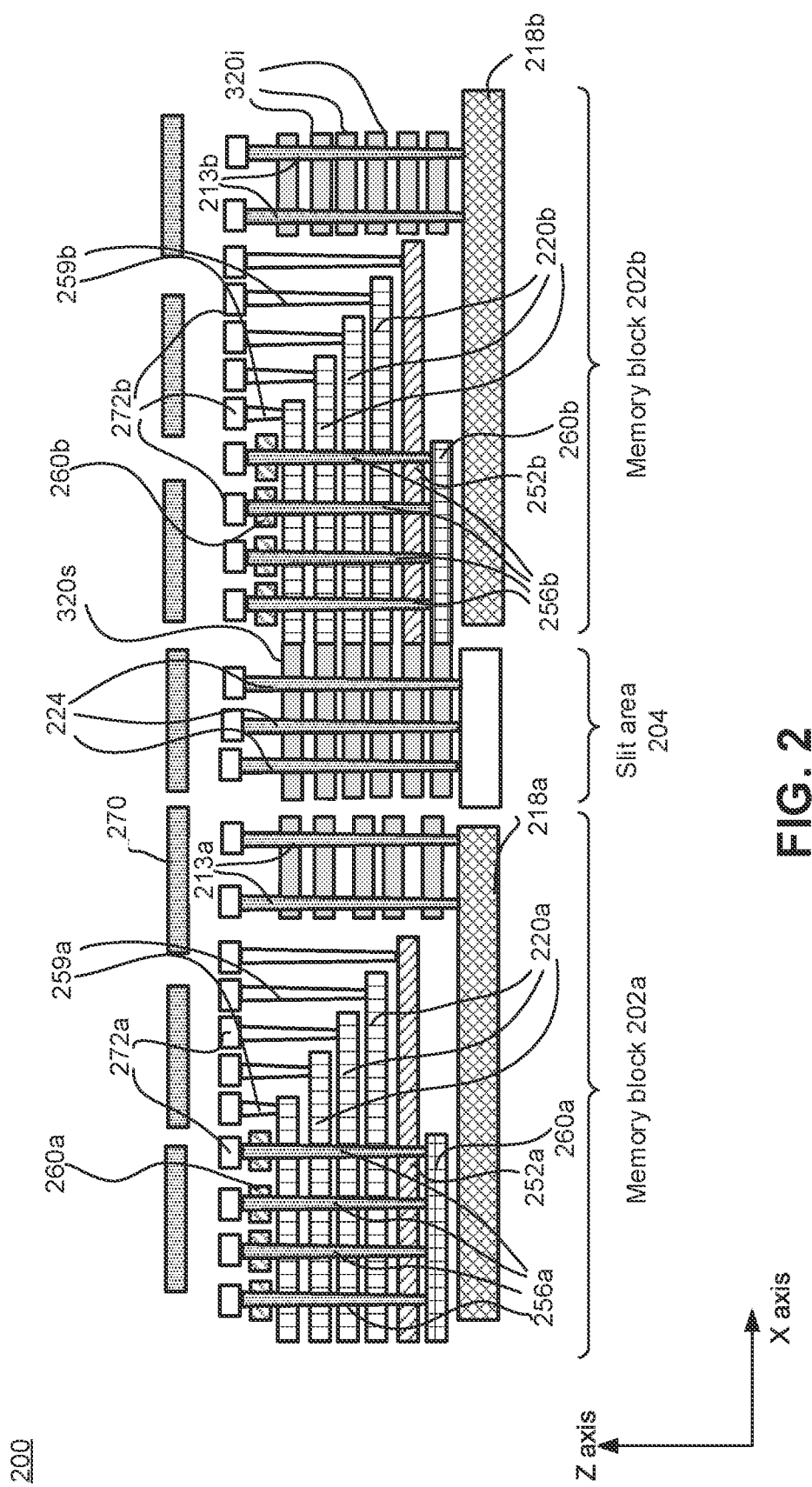
FIG. 2 illustrates a cross-sectional view of another integrated memory structure comprising a first memory block that includes first plurality of memory pillars, a second memory block that includes second plurality of memory pillars, and a slit area between the first and second memory blocks, wherein the slit area comprises a plurality of slit pillars that are at least in part similar to the memory pillars of the first and second memory blocks, in accordance with another embodiment of the present disclosure.

FIG. 2 illustrates a cross-sectional view of another integrated memory structure 200 (also referred to as a structure 200) comprising a first memory block 202a that includes first plurality of memory pillars 256a, a second memory block 202b that includes second plurality of memory pillars 256b, and a slit area 204 between the first and second memory blocks 202a, 202b, wherein the slit area 204 comprises a plurality of slit pillars 224 that are at least in part similar to the memory pillars 256a, 256b, in accordance with some embodiments of the present disclosure. Various components of the memory structure 200 of FIG. 2 are at least in part similar to corresponding components of the memory structure 100 of FIG. 1A. However, the memory blocks 102a, 102b in FIG. 1A were arranged in a mirrored image manner, where the WL staircases in the memory structure 100 where facing the opposite directions. In contrast, the arrangement of the memory block 202a in FIG. 2 is flipped, such that the WL staircases in the memory structure 200 are facing in the same direction. The memory structure 200 of FIG. 2 will be apparent from the discussion of the memory structure 100 of FIG. 1A.

Figure 3A:
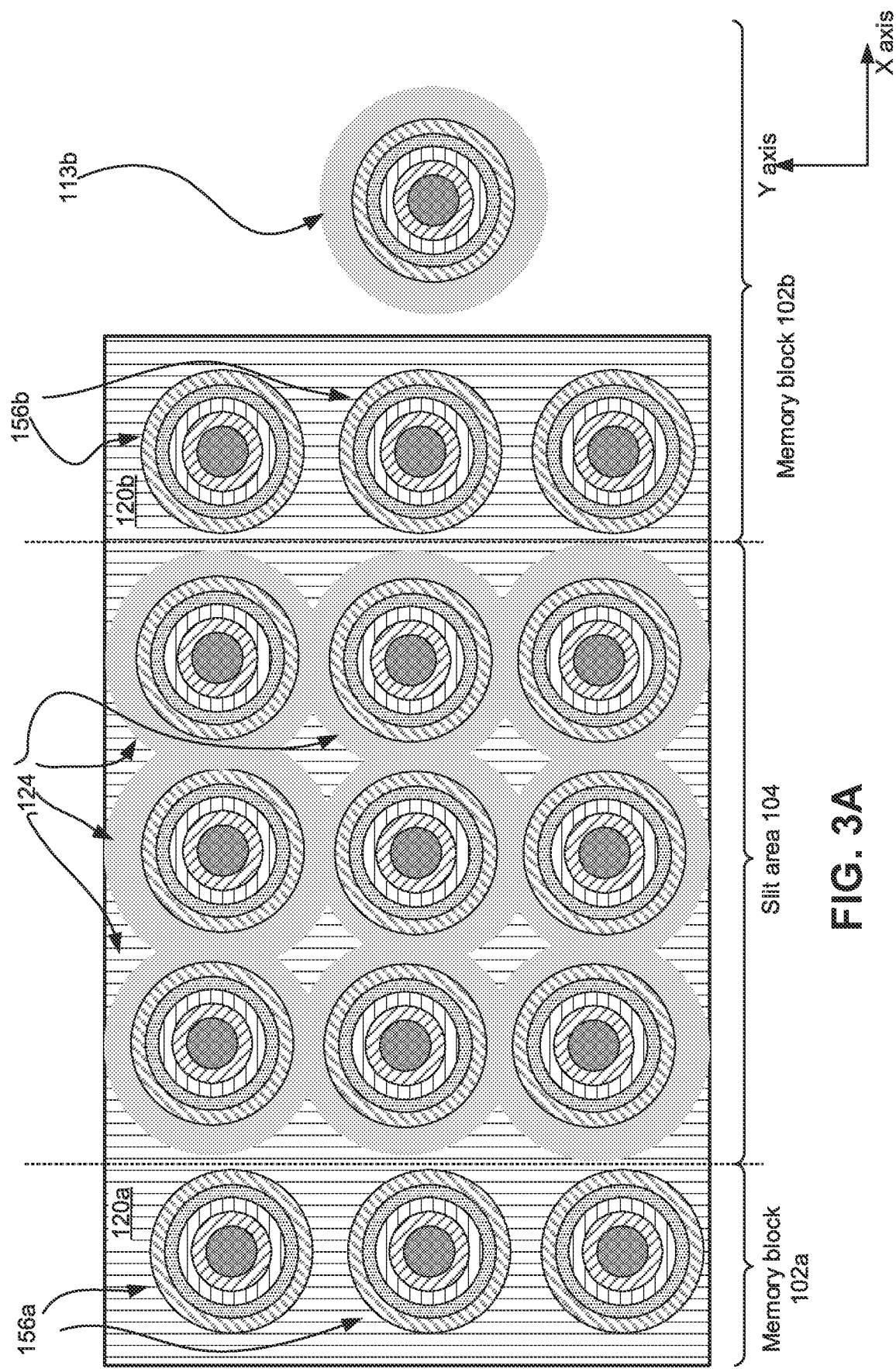
FIG. 3A is a top-down or plane view of a memory structure in which a plurality of slit pillars electrically isolates two adjacent memory blocks, in accordance with some embodiments of the present disclosure.

FIG. 3A is a top-down or plane view of the memory structure 100 of FIG. 1A along the plane AA (the plane AA shown using dotted line in FIG. 1A), in accordance with some embodiments of the present disclosure. As illustrated in FIG. 3A, a WL 120 is a sheet comprising a conductive material, such as tungsten, polysilicon, an appropriate metal, and/or any appropriate conductive material. A left section of the sheet forms a WL 120a of the memory block 102a, and a right section of the sheet forms a WL 120b of the memory block 102b. The slit area 104 separates and electrically isolates the WLs 102a and 102b, without which the two WLs 102a, 102b would have been electrically coupled to each other.

In FIG. 3A, a row of memory pillars 156a of the memory block 102a, and a row of memory pillars 156b of the memory block 102b are illustrated. Each row of memory pillars 156 is illustrated to include three memory pillars 156, although a row can include any different number of memory pillars. Note that each of the memory blocks 102 can include several such rows of memory pillars, although a single row of such pillars is illustrated. Merely as an example, in FIG. 1A, each of the memory blocks 102 is illustrated to include four such rows of memory pillars 156.

Also illustrated in FIG. 3A are the slit pillars 124 in the slit area 104. For example, three rows of slit pillars 124 are illustrated, with each row including three slit pillars 124.

The memory block 102b is not illustrated in its entirety—rather, a left section of the memory block 102b including the row of memory pillars 156b, and a right section of the memory block 102b including an interconnect pillar 113 is illustrated. Components between the illustrated row of memory pillars 156b and the interconnect pillar 113 are omitted in FIG. 3A for purposes of illustrative clarity.

Figure 3C:
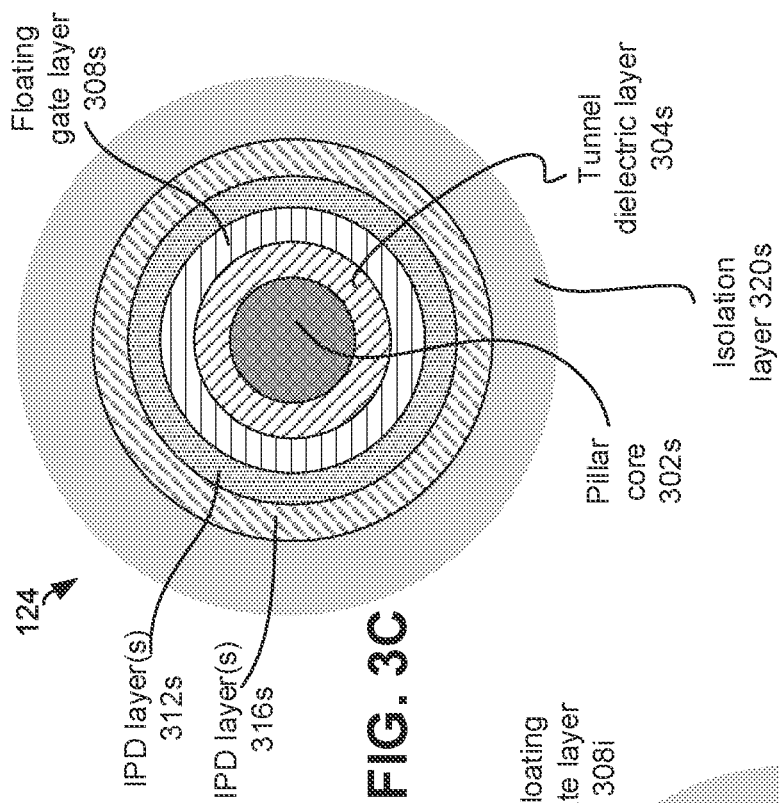
FIGS. 3B, 3C, and 3D respectively illustrate top-down views of a memory pillar, a slit pillar, and an interconnect pillar, respectively, in accordance with some embodiments of the present disclosure.
Figure 3B:
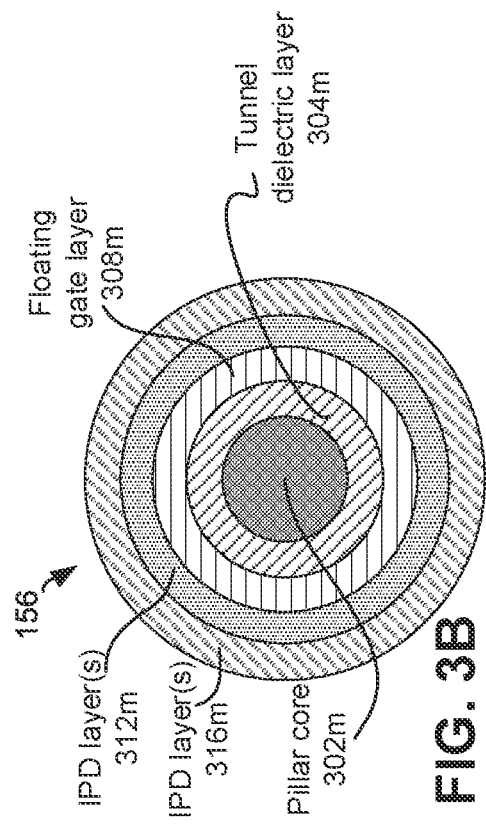
Figure 3D:
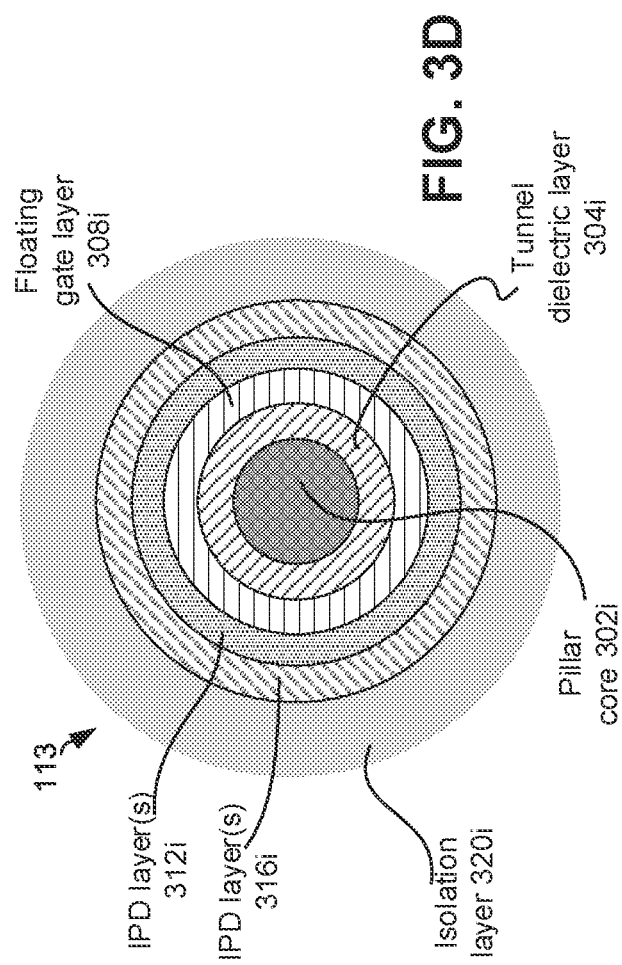

FIGS. 3B, 3C, and 3D respectively illustrate in further details top-down views of a memory pillar 156, a slit pillar 124, and an interconnect pillar 113, in accordance with some embodiments of the present disclosure. In some embodiments, structures of each of the memory pillar 156, the slit pillar 124, and the interconnect pillar 113 are at least in part similar. In FIG. 3B, various components of the memory pillar 156 are labelled with a suffix "m". In FIG. 3C, various components of the slit pillar 124 are labelled with a suffix "s". In FIG. 3D, various components of the interconnect pillar 113 are labelled with a suffix "i".

Referring to FIGS. 3A, 3B, 3C, and 3D, in some embodiments, the memory pillar 156 comprises a pillar core 302m, the slit pillar 124 comprises a pillar core 302s, and the interconnect pillar 113 comprises a pillar core 302i. In some embodiments, the pillar core 302 of each of the memory pillar 156, the slit pillar 124, and the interconnect pillar 113 comprise similar material, and/or have similar dimensions.

In some embodiments, each pillar core 302 comprises non-conductive core material, and semiconductor material formed on the non-conductive core material. For example, although not illustrated, for each pillar core 302, a channel is formed on a corresponding core material. Non-limiting examples of semiconductor material of the channel include silicon, polysilicon, gallium, gallium arsenide, and/or combinations thereof. In some embodiments, the channel is a doped hollow channel (DHC), and the channel comprise any appropriate conductor or semiconductor material, which can include a single or multiple different materials. The channel is also referred to herein as region or layer comprising semiconductor material. The core material comprises non-conductive material, such as any appropriate oxide material and/or nitride material, although any other appropriate non-conductive material can also be used.

In some embodiments, the pillar core 302 of each of the memory pillar 156, the slit pillar 124, and the interconnect pillar 113 is surrounded at least in part by tunnel dielectric layer 304. For example, the memory pillar 156 comprises tunnel dielectric layer 304m at least in part around the pillar core 302m, the slit pillar 124 comprises tunnel dielectric layer 304s at least in part around the pillar core 302s, and the interconnect pillar 156 comprises tunnel dielectric layer 304i at least in part around the pillar core 302i. For example, the tunnel dielectric layer 304 comprises an oxide material (e.g., silicon oxide). In another example, the tunnel dielectric layer 304 comprises multiple layers (e.g., oxide/nitride/oxide (O/N/O)).

In some embodiments, the tunnel dielectric layer 304 of each of the memory pillar 156, the slit pillar 124, and the interconnect pillar 113 is surrounded at least in part by a floating gate layer 308. For example, the memory pillar 156 comprises floating gate layer 308m around the tunnel dielectric layer 304m, the slit pillar 124 comprises floating gate layer 308s around the tunnel dielectric layer 304s, and the interconnect pillar 156 comprises floating gate layer 308i around the tunnel dielectric layer 304i. For example, for the memory pillar 156, the floating gate layer 308m is used to store charge, the hence, floating gate layer 308 is also generally referred to as a charge-storage structure. The floating gate layer 308 comprises conductive or semi-conductive material, such as polysilicon, SiN, silicated or non-silicated metal such as ruthenium (Ru), platinum (Pt), germanium (Ge), etc., with metals being either continuous or discontinuous.

For each of the pillars 156, 124, 113, the floating gate layer 308 is surrounded by two or more inter-poly dielectric (IPD) layers, such as IPD layers 312, 316. Although two IPD layers 312, 316 are illustrated in each pillar, more than two IPD layers may be possible. The IPD layers are also referred to as IPD1, IPD2, IPD3, and IPD4 (e.g., in case four IPD layers are present in each pillar). Thus, IPD layer(s) 312m in the memory pillar 156 can be representative of a single IPD layer, or more than one IPD layer (such as IPD3 layer, IPD4 layer). Similarly, IPD layer(s) 316m in the memory pillar 156 can be representative of a single IPD layer, or more than one IPD layer (such as IPD1 layer, IPD2 layer).

Merely as an example, for each pillar 156, 124, 113, a plurality of IPD layers, such as IPD1, IPD2, IPD3, and IPD4 (e.g., in case four IPD layers are present in each pillar) are laterally between the floating gate layer 308 and the WL 120. For example, the IPD1 layer is nearest to the WL, and is between IPD2 and the WL; IPD2 layer is between IPD3 and IPD1 layer; IPD3 layer is between IPD2 and IPD4 layer; and finally, IPD4 layer is between IPD3 and the floating gate layer 308.

In some embodiments, the IPD1, IPD2, IPD3, IPD4 layers comprises appropriate dielectric material. In an example embodiment, the IPD1 layer comprises material including oxygen. For example, the IPD1 layer comprises oxide material (e.g., silicon oxide), an oxynitride material (e.g., silicon oxynitride), a high dielectric constant material (e.g., HfSiOx, HfOx, AlOx, and ZrOx), etc. In some embodiments, the IPD2 layer comprises material including nitrogen. For example, the IPD2 layer comprises a nitride material (e.g., silicon nitride). In an embodiment, the IPD3 layer comprises a material including oxygen. For example, the IPD3 layer comprises an oxide material (e.g., silicon oxide), an oxynitride material (e.g., silicon oxynitride), a high dielectric constant material (e.g., HfSiOx, HfOx, AlOx, and ZrOx), etc. In an example embodiment, the IPD4 layer comprises a nitride material (e.g., silicon nitride), an oxide material (e.g., aluminum oxide), a high dielectric constant material (e.g., HfOx, HfAlOx, AlOx, and ZrOx), etc. In an embodiment, the IPD4 layer may be absent in each of the pillars 156, 124, and 113. In an embodiment, the IPD1, IPD2, IPD3, IPD4 layers can be configured as NONO (nitride/oxide/nitride/oxide) or as AONO (AlOx/oxide/nitride/oxide) in successive layers.

Thus, as discussed and illustrated in FIGS. 3A-3D, each of the memory pillar 156, the slit pillar 124, and the interconnect pillar 113 comprises the pillar core 302, the tunnel dielectric layer 304, the floating gate layer 308, and two or more IPD layers 312, 316 (generally referred to as IPD1, IPD2, IPD3, IPD4 layers herein). Thus, the structure of the each of the memory pillar 156, the slit pillar 124, and the interconnect pillar 113 are at least in part similar.

In some embodiments, unlike the memory pillar 156, the slit pillar 124 and the interconnect pillar 113 comprises isolation layer 320 disposed on an outer periphery. For example, the slit pillar 124 comprises isolation layer 320s, and the interconnect pillar 113 comprises isolation layer 320i. As illustrated in FIGS. 3A and 3B, the memory pillar 156 is not surrounded by any such isolation layer. As illustrated in FIG. 1A, there are multiple levels of each of the isolation layers 320s, 320i, and only one such level of the isolation layers 320s, 320i are illustrated in FIGS. 3C and 3D, respectively.

As illustrated in FIG. 3A, the isolation layer 320s of the various rows of the slit pillars 124 in the slit area 104 form a continuous layer of separation between the WL 120a and the WL 120b, thereby electrically isolating the WLs 120a, 120b. Without the isolation layers 320s of the various slit pillars 124, the dummy slit pillars 124 would not have been able to electrically isolate the WL 120a and the WL 120b. Similarly, the interconnect pillar 113 need not be in contact with adjacent components, and the isolation layer 320i isolates the interconnect pillar 113 from any adjacent components.

FIG. 3E is a top-down or plane view of the memory structure 100a of FIG. 1B along the plane BB (the plane BB shown using dotted line in FIG. 1B), in accordance with some embodiments of the present disclosure. As illustrated in FIG. 3E, a WL 120b is a sheet comprising a conductive material, such as tungsten, polysilicon, an appropriate metal, and/or any appropriate conductive material, as also discussed with respect to FIG. 3A. A section of the sheet forms the WL 120b of the memory block 102b.

In FIG. 3E, rows of memory pillars 156b of the memory block 102b are illustrated, with an interconnect pillar 113 interposed between the memory pillars 156b. As discussed with respect to FIG. 3D, the interconnect pillar 113 comprises the isolation layers 320i, which electrically isolates the interconnect pillar 113 from the WL 120b. As illustrated in FIG. 1A, there are multiple levels of isolation layers 320i, and only one such level of the isolation layer 320i is illustrated in FIG. 3E.

Figure 3F:
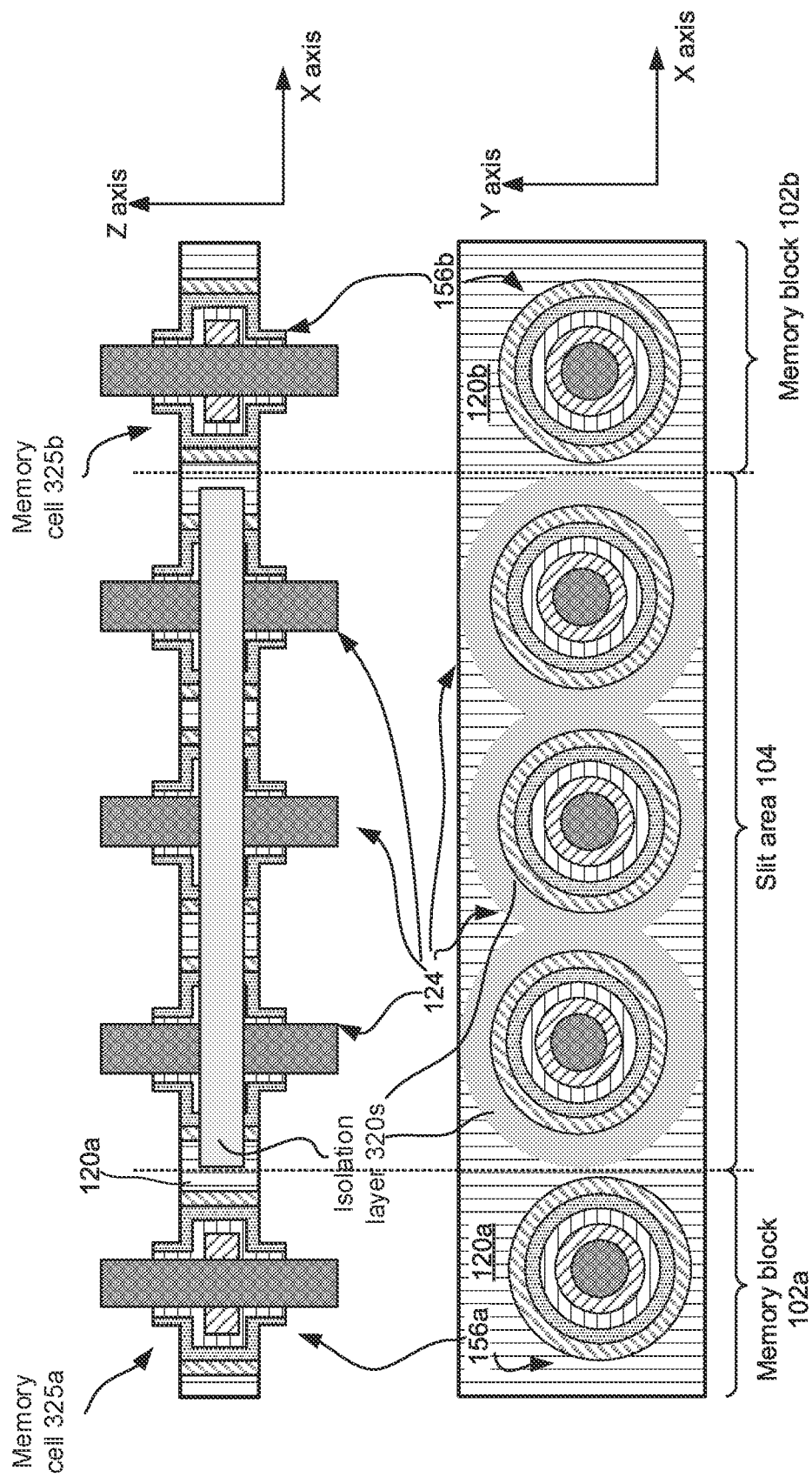
FIG. 3F illustrates a cross-sectional view and a top-down view of a section of the memory structure of FIG. 1A, in accordance with some embodiments of the present disclosure.

FIG. 3F illustrates a cross-sectional view and a top-down view of a section of the memory structure 100 of FIG. 1A in further details, in accordance with some embodiments of the present disclosure. For example, the top portion of FIG. 3F illustrates the cross-sectional view, and the bottom portion of FIG. 3F illustrates the corresponding top-down view. The top-down view of FIG. 3F is at least in part similar to at least a portion of the illustration of FIG. 3A. For example, FIG. 3F illustrates a memory pillar 156a of the memory block 102a, a memory pillar 156b of the memory block 102b, and three slit pillars 124 in the slit area 104 between the two memory blocks. As seen, a memory cell 325a is formed at the intersection of the memory pillar 156a and the WL 120a, and a memory cell 325b is formed at the intersection of the memory pillar 156b and the WL 120b.

In some embodiments, the isolation layers 320s of the various slit pillars 124 merges, to form a continuous barrier of isolation layer between the memory blocks 102a, 102b. For example, as will be discussed in further details with respect to FIG. 5A-5I, recesses within the WLs are formed around the slit pillars 124, and the recesses are merged. The recesses are merged to form a continuous recess within the WLs, and are subsequently filed with dielectric and/or insulating material, to form the continuous barrier of isolation layer 320 between the memory blocks 102a, 102b.

Thus, as discussed, in some embodiments, the slit pillars, the interconnect pillars, and the memory pillars have at least in part similar structure. For example, each of these pillars includes a pillar core 302 comprising non-conductive core material, and a layer of doped semiconductor material disposed thereon (where the semiconductor material forms the channel of the memory pillars). As discussed, the slit pillars 124 and the interconnect pillars 113 are dummy pillars, as these pillars are separated from the adjacent WLs by the isolation layer 320. Hence, for the slit and interconnect pillars, no memory cells are formed in the junctions of between the WLs and the corresponding pillars. Hence, for the slit and interconnect pillars, the WLs 120 cannot influence the electrical conduction of the doped semiconductor material disposed on the non-conductive core material of the pillar core. For example, in the interconnect pillars 113, the doped semiconductor material disposed on the non-conductive core material of the pillar core conducts current between the top-of-the memory block circuitry and the bottom-of-the memory block circuitry. In the slit pillars 124, the doped semiconductor material disposed on the non-conductive core material of the pillar core can also conduct current—but because the slit pillars are not coupled to any electrical circuitry, the slit pillars do not conduct current and is used for slit-level isolation between memory blocks. In contrast, in a memory pillar 156, there is no isolation layer between the pillar and the WL, and memory cells are formed in the junction of the WLs and the memory pillar 156. For the memory pillar 156, the layer of doped semiconductor material disposed on the non-conductive material of the pillar core 302 acts as a channel layer, by selectively conducting current based on the operation of the associated memory cells.

FIG. 4 illustrates a cross-sectional view of an integrated memory structure 400 comprising a first memory block 402a that includes a first memory pillar 456a, a second memory block 402b that includes a second memory pillar 456b, a slit pillar 424 within a slit area 404 between the first and second memory blocks, and an interconnect pillar 413 within the second memory block 402b, where the slit pillar 424 and the interconnect pillar 413 have structures that are at least in part similar to the structure of the first and second memory pillars 456a, 456b, in accordance with some embodiments of the present disclosure. The various pillars extend through a plurality of WLs 420a in the first memory block 402a and a plurality of WLs 420b in the second memory block 402b. The WLs 420 are embedded within dielectric material 512, such that alternating layers of dielectric material 512 and WLs 420 are formed in the memory blocks 402a, 402b. The integrated memory structure 400 is a simplified view of the integrated memory structure 100a of FIG. 1B, with several components omitted for purposes of illustrative clarity.

FIGS. 5A, 5B, 5C, 5D, 5E, 5F, 5G, 5H, and 5I collectively illustrate a method for forming a memory structure (such as the memory structure 400 of FIG. 4A) comprising a first memory block that includes a first memory pillar, a second memory block that includes a second memory pillar, a slit pillar within a slit area between the first and second memory blocks, and an interconnect pillar within the second memory block, where the slit pillar and the interconnect pillar have structures that are at least in part similar to the structure of the first and second memory pillars, in accordance with some embodiments of the present disclosure.

Referring to FIG. 5A, illustrated is the memory structure 400 comprising the WLs 420 over a substrate 501. The substrate 501 is merely symbolic, and is representative of any component, substrate, and/or circuitry (such as the logic circuitry 118 of FIG. 1A) over which the memory blocks are to be formed. In some embodiments, the WLs 420 are embedded within an appropriate dielectric material 512, such as an appropriate oxide and/or nitride compound. Alternating layers of dielectric material 512 and WLs 420 are formed in the memory blocks 402a, 402b.

Also illustrated in FIG. 5A are two trenches 510m, a trench 510s, and a trench 510i, formed through the WLs 420 and the dielectric material 512. As will be discussed herein later, memory pillars 456a, 456b will eventually be formed within the trenches 510m, the slit pillar 424 will eventually be formed within the trench 510s, and the interconnect pillar 413 will eventually be formed within the trench 510i. The trenches can be formed using any appropriate trench forming technique, such as an appropriate directional etching process.

It may be noted that individual WL 420 in FIG. 5B is a sheet (as discussed with respect to FIG. 3A), with the various trenches extending through the WLs. There is no electrical isolation yet between a section of a specific WL 420 of the first memory block 402a and another section of the specific WL 420 of the second memory block 402b.

Referring now to FIG. 5B, liners 516 are formed on sidewalls of the trenches 510m, 510s, 510i. The liners 516 can be formed by any appropriate deposition techniques, such as atomic layer deposition (ALD), plasma enhanced ALD (PEALD), physical vapor deposition (PVD), chemical vapor deposition (CVD), electrochemical deposition (ECD), molecular beam epitaxy (MBE), and/or other suitable deposition process. In some embodiments, two layers of liners 516 can be deposited. Merely as an example, a first layer of the liners 516 can be an appropriate nitride liner, such as Silicon nitride (SiN) liner. After the nitride liner is deposited, an additional layer of the liners 516 can be deposited, such as an oxide liner.

Referring now to FIG. 5C, a patterned mask 520 is deposited on top of the memory structure 400. The mask 520 has openings, through which the trenches 510s, 510i are exposed, and the mask 520 covers and protects the trenches 510m.

Referring now to FIG. 5D, the liners 516 are removed from the sidewall of the trenches 510s and 510i through the openings in the mask 520, e.g., by an appropriate etching technique. For example, an appropriate wet etching technique can be employed to remove the liners 516 from the sidewall of the trenches 510s and 510i. The liners 516 are not removed from the trenches 510m, as the trenches 510m are protected by the mask 520.

Referring now to FIG. 5E, the mask 520 is removed. Thus, in FIG. 5E, the sidewalls of the trenches 510s, 510i are exposed, while the sidewalls of the trenches 510m are protected by the liners 516. As illustrated, sections of the WLs 420 are also exposed through the sidewalls of the trenches 510s, 510i.

Referring now to FIG. 5F, sections of the WLs 420, which were exposed through the sidewalls of the trenches 510s, 510i, are selectively etched. Thus, the WLs 420 are selectively recessed through the trenches 510s, 510i. Note that the WLs 420 adjoining the trenches 510m are not etched, as the liners 516 protect the WLs 420 adjoining the trenches 510m.

Any appropriate wet etching technique can be employed to form the recesses of the WLs 420 exposed through the trenches 510s, 510i. In some embodiments, the etchant is selected such that the etchant selectively etches the WLs 420, while not etching the liners 516 and the dielectric material 512. For example, the dielectric material 512, the liners 516, and the WLs 420 may be selected such that these layers have etch selectivity with respect to each other. Also note that being able to selectively etch a first material relative to a second material includes being able to use a process that removes the first material at least 1.5, 2, 3, 5, 10, 20, 50, or 100 times faster than that same process removes the second material, or at least some other relative amount. Accordingly, the selective etch processes may include various etchants, temperatures, and pressures, as desired, to enable the desired selectivity of the process.

Referring now to FIG. 5G, the recesses formed by etching of the WLs 420 are filled with isolation material 320 using an appropriate deposition technique. For example, isolation material 320s is filled through the trench 510s, and isolation material 320i is filled through the trench 510i. An appropriate isolation material can be used, such as any appropriate dielectric material and/or insulating material like an appropriate oxide, an appropriate nitride, or a combination of oxide and nitride. In some embodiments, instead of filling the recessed portions of the WLs 420 with isolation material 320, the recessed portion can be void, i.e., filled with air or other gas, which can also act as isolation material.

Referring now to FIG. 5H, the liners 516 are now removed or etched from the trenches 510m. For example, an appropriate wet etching technique can be employed to remove the liners 516 from the sidewall of the trenches 510m.

Referring now to FIG. 5I, the memory pillars 456a, 456b are formed within the trenches 510m, the slit pillar 424 is formed within the trench 510s, and the interconnect pillar 413 is formed within the trench 510i. The various types of pillars are formed with the corresponding tranches by any appropriate process for memory pillar formation in a 3D memory array. For example, as discussed with respect to FIGS. 3B-3D, each of the memory pillars 456a, 456b, slit pillar 424, and interconnect pillar 413 comprises a pillar core, tunnel dielectric layer, floating gate layer, and various IPD layers. The memory structure of FIG. 5I corresponds to the memory structure 400 of FIG. 4.

Figure 6:
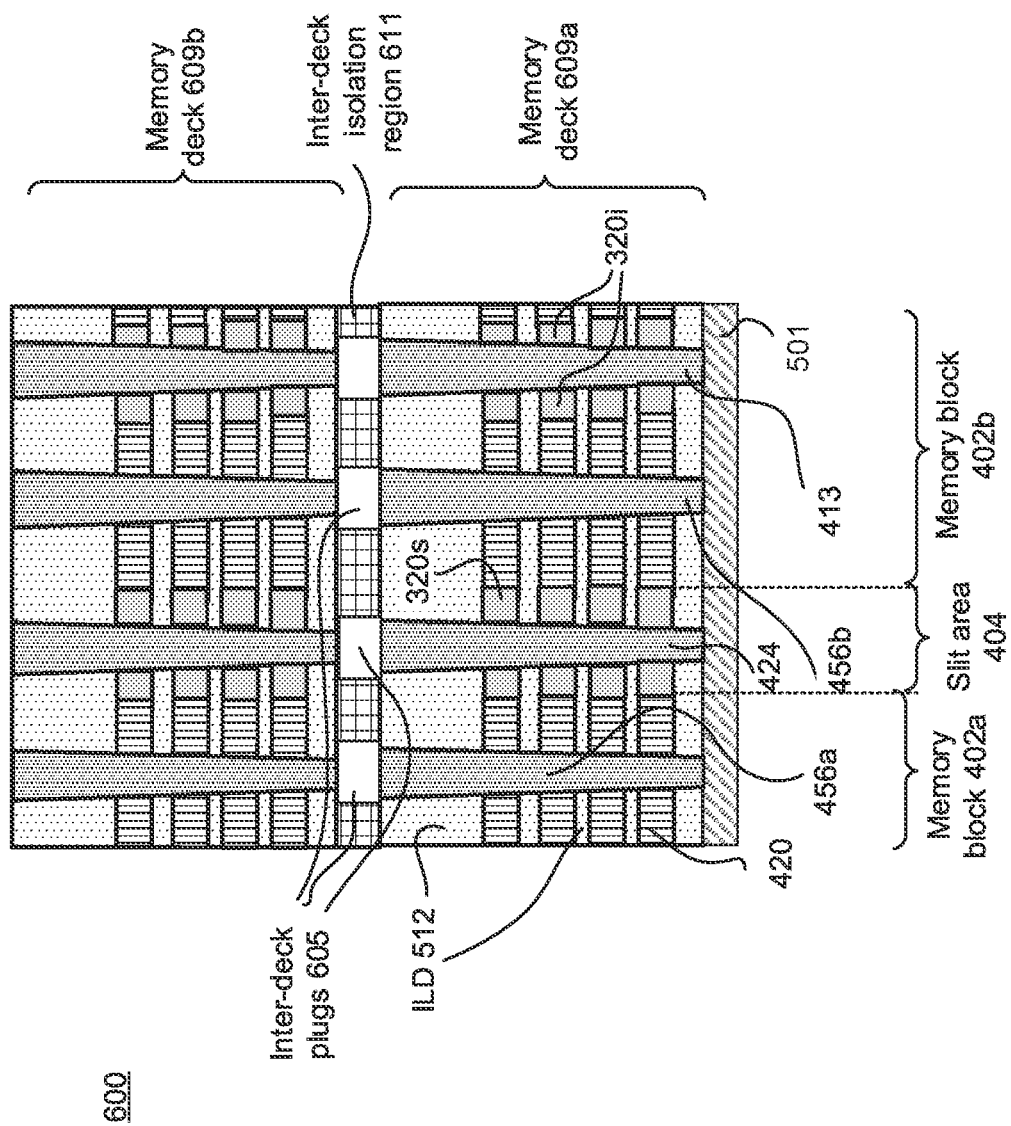
FIG. 6 illustrates a cross-sectional view of a multi-deck integrated memory structure comprising a first memory deck and a second memory deck, where each memory deck comprises at least a first memory block that includes first plurality of memory pillars, a second memory block that includes second plurality of memory pillars, and a slit area between the first and second memory blocks, wherein the slit area comprises one or more slit pillars that are at least in part similar to the memory pillars, and wherein at least one memory block comprises an interconnect pillar that is at least in part similar to the memory pillars, in accordance with some embodiments of the present disclosure.

FIGS. 1A-5I illustrate memory blocks included in a single memory deck. However, the teachings of this disclosure can be applied to multi-deck memory structures as well. FIG. 6 illustrates a cross-sectional view of a multi-deck integrated memory structure 600 comprising a first memory deck 609a and a second memory deck 609b, where each memory deck comprises at least a first memory block that includes first plurality of memory pillars, a second memory block that includes second plurality of memory pillars, and a slit area between the first and second memory blocks, wherein the slit area comprises one or more slit pillars that are at least in part similar to the memory pillars, and wherein at least one memory block comprises an interconnect pillar that is at least in part similar to the memory pillars, in accordance with some embodiments of the present disclosure.

The lower memory deck 609a is substantially similar to the memory structure 400 of FIGS. 4 and 5I, and have been labelled using the same labels used in FIGS. 4 and 5I. The upper memory deck 609b is at least in part similar to the lower memory deck 609b, and accordingly, components of the upper memory deck 609b have not been labelled.

An inter-deck isolation region 611 between the two memory decks separates the two memory decks. The inter-deck isolation region 611 comprise electrically insulating material, such as an oxide, a nitride, a combination of oxide and nitride, and/or other appropriate electrically insulating material.

A pillar of the upper memory deck 609b is aligned with a corresponding pillar of the lower memory deck 609a, and is separated by a corresponding inter-deck plug 605. In some embodiments, an inter-deck plug 605 protects a corresponding lower pillar (i.e., the corresponding pillar in the lower memory deck), when a corresponding upper pillar and the upper memory deck are formed above the lower pillar 124a. The inter-deck plugs 605 comprise an appropriate conductive material capable of protecting the underneath pillar, and establishing electrical connectivity between two corresponding pillars. For example, the inter-deck plugs 605 comprise an appropriate semiconductor material, silicon, polysilicon, gallium, and/or gallium arsenide. In some embodiments, the inter-deck plugs 605 are un-doped, while in some other embodiments the inter-deck plugs 605 are doped or heavily doped. In an example, the inter-deck plugs 605 comprise a material that is the same as a material of channels of the memory pillars, or that is different from the channel material.

Formation of the various pillars (such as the memory pillars, the slit pillars, and the interconnect pillars) of the upper memory deck 609b will be apparent from the formation process of the pillars of the lower memory deck 609a discussed with respect to FIGS. 5A-5I. For example, once the lower memory deck 609a, the isolation region 611, and the plugs 605 are formed (e.g., at least in part in accordance with FIGS. 5A-5I), the process is repeated for the upper memory deck 609 as well.

Figure 7:
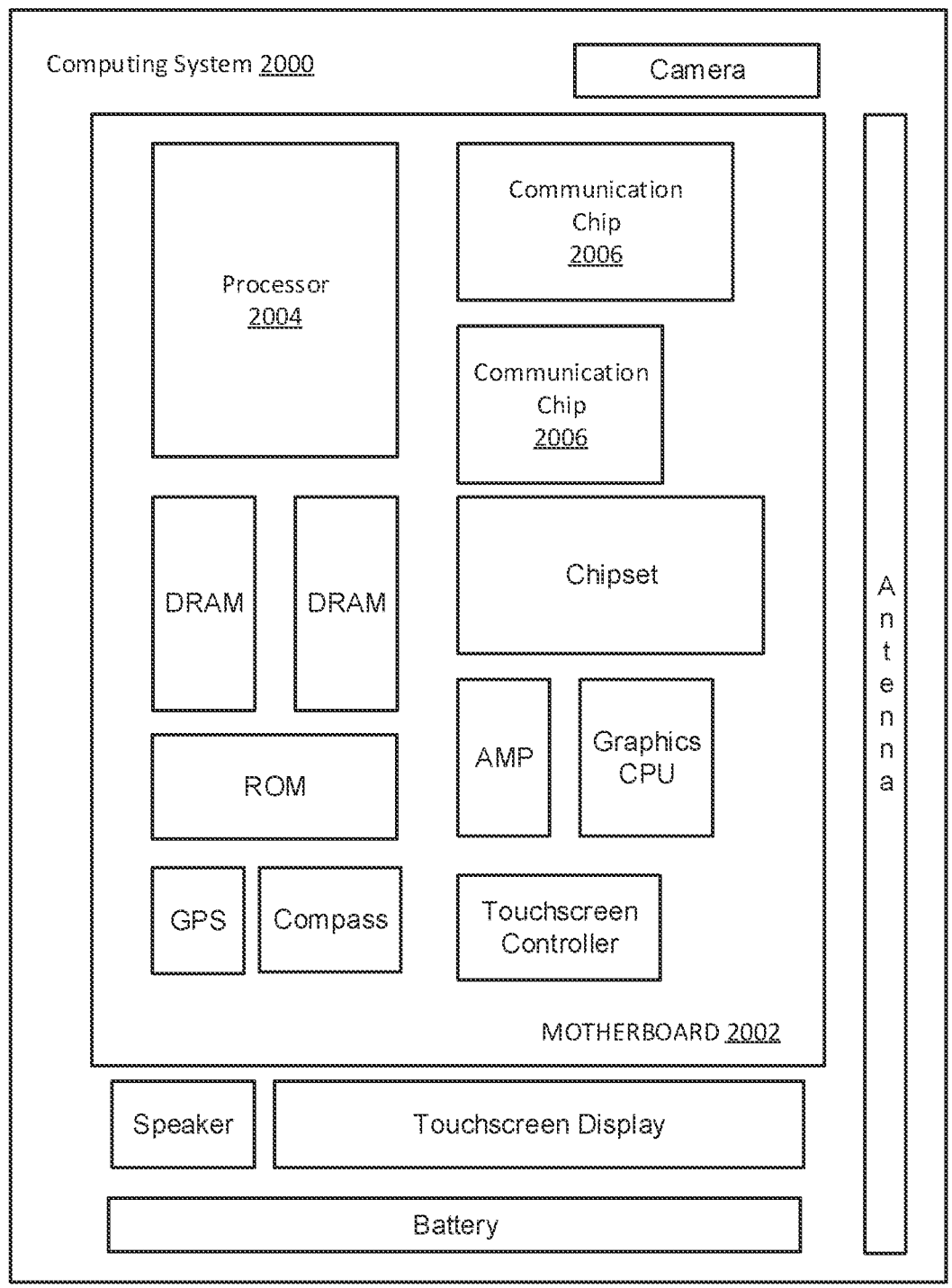
FIG. 7 illustrates an example computing system implemented with one or more integrated memory structures disclosed herein, in accordance with one or more embodiments of the present disclosure.

FIG. 7 illustrates an example computing system implemented with integrated memory structures disclosed herein, in accordance with one or more embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board, whether a main board, a daughterboard mounted on a main board, or the only board of system 2000, etc.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM, flash memory such as 3D NAND flash memory), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 2006 can be part of or otherwise integrated into the processor 2004).

Any memory, such as any flash memory (e.g., a 3D NAND flash memory), included in computing system 2000 may include memory blocks having slit pillars and/or interconnect pillars having structure that are at least in part similar to a structure of a memory pillar.

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing system 2000 includes an integrated circuit die packaged within the processor 2004. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing system 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices, as variously described herein.

Further Example Embodiments

Numerous variations and configurations will be apparent in light of this disclosure and the following examples.

Example 1. An integrated circuit memory comprising: a first memory block including a first pillar and a first Word Line (WL), the first pillar passing through the first WL to provide a first memory cell; a second memory block adjacent to the first memory block and including a second pillar and a second WL, the second pillar passing through the second WL to provide a second memory cell; and an isolation area between the first and second memory blocks, the isolation area to electrically isolate the first and second memory blocks, the isolation area comprising a third pillar that passes through a plane in which the first and second WLs reside, the third pillar electrically isolated from the first and second WLs.

Example 2. The integrated circuit memory of example 1, wherein: the first memory block further includes a third WL below the first WL, the first pillar also passing through the third WL to provide a third memory cell; the second memory block further includes a fourth WL below the second WL, the second pillar also passing through the fourth WL to provide a fourth memory cell; and the third pillar passes through a plane in which the third and fourth WLs reside and is electrically isolated from the third and fourth WLs.

Example 3. The integrated circuit memory of any of examples 1-2, wherein the isolation area comprises: insulator material arranged around a periphery of the third pillar.

Example 4. The integrated circuit memory of example 3, wherein the third pillar extends through the insulator material.

Example 5. The integrated circuit memory of any of examples 3-4, wherein the insulator material is a first isolation layer at a first location along the third pillar, and wherein the isolation area further comprises: a second isolation layer arranged around the periphery of the third pillar at a second location different from the first location.

Example 6. The integrated circuit memory of example 5, wherein the first isolation layer resides in a first horizontal plane, wherein the second isolation layer resides in a second horizontal plane, and the first horizontal plane and the second horizontal plane are parallel to one another.

Example 7. The integrated circuit memory of example 1, wherein the each of the first memory block and the second memory block comprises a plurality of tiers of WLs, and wherein the isolation area comprises: a plurality of tiers of isolation layers, each isolation layer to electrically isolate a corresponding WL of the first memory block from a corresponding WL of the second memory block.

Example 8. The integrated circuit memory of example 7, wherein the isolation layers comprise an oxide material.

Example 9. The integrated circuit memory of any of examples 1-8, wherein the first and second pillar are both multilayer structures, and the first pillar has the same materials and configuration as the third pillar, except that the third pillar is electrically isolated from the first and second WLs with insulator material.

Example 10. The integrated circuit memory of any of examples 1-9, wherein each of the first pillar and the third pillar comprises: a pillar core comprising non-conductive core material, and a layer of semiconductor material around the non-conductive core material; a dielectric layer around at least a section of the pillar core; a floating gate layer around at least a section of the dielectric layer; and two or more inter-poly dielectric (IPD) layers around at least a section of the floating gate layer.

Example 11. The integrated circuit memory of any of examples 1-10, wherein each of the first pillar and the second pillars are memory pillars, and the third pillar is a dummy pillar.

Example 12. The integrated circuit memory of any of examples 1-11, wherein each of the first, second, and third pillar extends through a plurality of Word Lines (WL) of the first and second memory blocks.

Example 13. The integrated circuit memory of any of examples 1-12, further comprising: a fourth pillar extending from a top of the first memory block to bottom of the first memory block, the fourth pillar electrically connecting circuitry above the first memory block to circuitry below the first memory block; and a plurality of horizontal isolation layers arranged along a periphery of the fourth pillar.

Example 14. The integrated circuit memory of example 13, wherein each of the first pillar and the fourth pillar comprises: a pillar core comprising non-conductive core material, and a layer of semiconductor material around the non-conductive core material; a dielectric layer around at least a section of the pillar core; a floating gate layer around at least a section of the dielectric layer; and two or more inter-poly dielectric (IPD) layers around at least a section of the floating gate layer.

Example 15. The integrated circuit memory of any of examples 13-14, wherein the circuitry below the first memory block comprises one or more of an address decoder, a buffer, a word line driver, a bit line driver, a sense amplifier, a voltage divider, a charge pump, and/or a digital logic block.

Example 16. The integrated circuit memory of any of examples 13-15, wherein the circuitry below the first memory block comprises complementary metal-oxide-semiconductor (CMOS) logic.

Example 17. The integrated circuit memory of any of examples 1-16, wherein the memory array is a flash memory array.

Example 18. The integrated circuit memory of any of examples 1-17, wherein the memory array is a three-dimensional (3D) NAND memory array.

Example 19. A printed circuit board, wherein the integrated circuit memory of any of examples 1-18 is attached to the printed circuit board.

Example 20. A computing system comprising the integrated circuit memory of any of examples 1-19.

Example 21. An integrated circuit memory comprising: a plurality of Word Lines (WLs) including a first WL and a second WL; a plurality of pillars including a first pillar and a second pillar, the first and second pillars each extending through both the first and second WLs, wherein the first pillar is (i) electrically isolated from the first WL by a first isolation layer that extends on a first plane along a periphery of the first pillar, and (ii) electrically isolated from the second WL by a second isolation layer that extends on a second plane along the periphery of the first pillar; a first memory cell at a junction of the second pillar and the first WL; and a second memory cell at a junction of the second pillar and the second WL.

Example 22. The integrated circuit memory of example 21, wherein the first WL resides in the first plane of the first isolation layer, and the second WL resides in the second plane of the second isolation layer.

Example 23. The integrated circuit memory of any of examples 21-22, wherein: the second pillar is a memory pillar included in a first memory block of the integrated circuit memory; and the first pillar is a dummy pillar included in a slit area between the first memory block and an adjacent second memory block of the integrated circuit memory.

Example 24. The integrated circuit memory of any of examples 21-23, wherein each of the first pillar and the second pillar comprises: a pillar core; a dielectric layer around at least a section of the pillar core; a floating gate layer around at least a section of the dielectric layer; and two or more inter-poly dielectric (IPD) layers around at least a section of the floating gate layer.

Example 25. The integrated circuit memory of any of examples 21-24, wherein the first and second isolation layers comprise an oxide material.

Example 26. The integrated circuit memory of any of examples 21-25, wherein: a third pillar of the plurality of pillars is (i) electrically isolated from the first WL by a third isolation layer that extends on the first plane along a periphery of the third pillar, and (ii) electrically isolated from the second WL by a fourth isolation layer that extends on the second plane along the periphery of the third pillar, wherein the third pillar is to provide interconnection between first circuitry on a top section of the integrated circuit memory and second circuitry on a bottom section of the integrated circuit memory.

Example 27. The integrated circuit memory of example 26, wherein each of the first pillar and the third pillar comprises: a pillar core; a dielectric layer around at least a section of the pillar core; a floating gate layer around at least a section of the dielectric layer; and two or more inter-poly dielectric (IPD) layers around at least a section of the floating gate layer.

Example 28. The integrated circuit memory of any of examples 21-27, wherein the memory array is flash memory array.

Example 29. The integrated circuit memory of any of examples 21-28, wherein the memory array is three-dimensional (3D) NAND memory array.

Example 30. A motherboard, wherein the integrated circuit memory of example 21-29 is attached to the motherboard.

Example 31. A computing system comprising the integrated circuit memory of any of examples 21-30.

Example 32. A method to form an integrated flash memory structure, the method comprising: forming a first trench, a second trench, and a third trench that extend through a plurality of Word Lines (WLs); depositing a liner on sidewalls of the first trench, without depositing any liner on sidewalls of the second and third trenches; forming, through each of the second trench and the third trench, recesses within the WLs that abut the second and third trenches; depositing electrically isolating material within the recesses; removing the liner from the sidewalls of the first trench; and forming a first pillar in the first trench, a second pillar in the second trench, and a third pillar in the third trench.

Example 33. The method of example 32, wherein forming the first, second, and third pillars comprises: forming the first, second, and third pillars such that each of the first, second, and third pillars comprise (i) a pillar core, (ii) a dielectric layer around at least a section of the pillar core, (iii) a floating gate layer around at least a section of the dielectric layer, and (iv) two or more inter-poly dielectric (IPD) layers around at least a section of the floating gate layer.

Example 34. The method of any of examples 32-33, wherein: the electrically isolating material is deposited along a periphery of the second pillar and the third pillar, thereby isolating the second and third pillars from the plurality of WLs.

The foregoing detailed description has been presented for illustration. It is not intended to be exhaustive or to limit the disclosure to the precise form described. Many modifications and variations are possible in light of this disclosure. Therefore it is intended that the scope of this application be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit memory comprising:
   a first memory block including a first pillar and a first Word Line (WL), the first pillar passing through the first WL to provide a first memory cell;
   a second memory block adjacent to the first memory block and including a second pillar and a second WL, the second pillar passing through the second WL to provide a second memory cell; and
   an isolation area between the first and second memory blocks, the isolation area to electrically isolate the first and second memory blocks, the isolation area comprising a third pillar that passes through a plane in which the first and second WLs reside, the third pillar electrically isolated from the first and second WLs, wherein the isolation area includes insulator material arranged around a periphery of the third pillar, and wherein the first and second pillars are both multilayer structures, and the first pillar has the same materials and configuration as the third pillar, except that the third pillar is electrically isolated from the first and second WLs with insulator material.

2. The integrated circuit memory of claim 1, wherein:
   the first memory block further includes a third WL below the first WL, the first pillar also passing through the third WL to provide a third memory cell;
   the second memory block further includes a fourth WL below the second WL, the second pillar also passing through the fourth WL to provide a fourth memory cell; and
   the third pillar passes through a plane in which the third and fourth WLs reside and is electrically isolated from the third and fourth WLs.

3. The integrated circuit memory of claim 1, wherein the third pillar extends through the insulator material.

4. The integrated circuit memory of claim 1, wherein the insulator material is a first isolation layer at a first location along the third pillar, and wherein the isolation area further comprises:
   a second isolation layer arranged around the periphery of the third pillar at a second location different from the first location.

5. The integrated circuit memory of claim 4, wherein the first isolation layer resides in a first horizontal plane, wherein the second isolation layer resides in a second horizontal plane, and the first horizontal plane and the second horizontal plane are parallel to one another.

6. The integrated circuit memory of claim 1, wherein the each of the first memory block and the second memory block comprises a plurality of tiers of WLs, and wherein the isolation area comprises:
  a plurality of tiers of isolation layers, each isolation layer to electrically isolate a corresponding WL of the first memory block from a corresponding WL of the second memory block.

7. The integrated circuit memory of claim 6, wherein the isolation layers comprise an oxide material.

8. The integrated circuit memory of claim 1, wherein each of the first pillar and the third pillar comprises:
  a pillar core comprising non-conductive core material, and a layer of semiconductor material around the non-conductive core material;
  a dielectric layer around at least a section of the pillar core;
  a floating gate layer around at least a section of the dielectric layer; and
  two or more inter-poly dielectric (IPD) layers around at least a section of the floating gate layer.

9. The integrated circuit memory of claim 1, wherein each of the first pillar and the second pillar are memory pillars, and the third pillar is a dummy pillar.

10. The integrated circuit memory of claim 1, wherein each of the first, second, and third pillar extends through a plurality of Word Lines (WL) of the first and second memory blocks.

11. The integrated circuit memory of claim 1, further comprising:
  a fourth pillar extending from a top of the first memory block to bottom of the first memory block, the fourth pillar electrically connecting circuitry above the first memory block to circuitry below the first memory block; and
  a plurality of horizontal isolation layers arranged along a periphery of the fourth pillar.

12. The integrated circuit memory of claim 11, wherein each of the first pillar and the fourth pillar comprises:
  a pillar core comprising non-conductive core material, and a layer of semiconductor material around the non-conductive core material;
  a dielectric layer around at least a section of the pillar core;
  a floating gate layer around at least a section of the dielectric layer; and
  two or more inter-poly dielectric (IPD) layers around at least a section of the floating gate layer.

13. The integrated circuit memory of claim 11, wherein the circuitry below the first memory block comprises complementary metal-oxide-semiconductor (CMOS) logic.

14. The integrated circuit memory of claim 1, wherein the first memory cell and the second memory cell are included in a three-dimensional (3D) NAND memory array.

15. The integrated circuit memory of claim 1, wherein the integrated circuit memory is attached to a printed circuit board.

16. The integrated circuit memory of claim 1, wherein the integrated circuit memory is included in a computing system.

17. An integrated circuit memory comprising:
  a first memory block;
  a second memory block;
  a plurality of Word Lines (WLs) including a first WL and a second WL;
  a plurality of pillars including a dummy pillar and a memory pillar, the dummy pillar and memory pillars each extending through both the first and second WLs, wherein the dummy pillar is (i) electrically isolated from the first WL by a first isolation layer that extends on a first plane along a periphery of the dummy pillar, and (ii) electrically isolated from the second WL by a second isolation layer that extends on a second plane along the periphery of the dummy pillar, wherein the dummy pillar is included in a slit area between the first memory block and the second memory block;
  a first memory cell at a junction of the memory pillar and the first WL; and
  a second memory cell at a junction of the memory pillar and the second WL, wherein each of the dummy pillar and the memory pillar comprises:
    a pillar core;
    a dielectric layer around at least a section of the pillar core;
    a floating gate layer around at least a section of the dielectric layer; and
    two or more inter-poly dielectric (IPD) layers around at least a section of the floating gate layer.

18. The integrated circuit memory of claim 17, wherein the first WL resides in the first plane of the first isolation layer, and the second WL resides in the second plane of the second isolation layer.

19. A method to form an integrated flash memory structure, the method comprising:
  forming a first trench, a second trench, and a third trench that extend through a plurality of Word Lines (WLs);
  depositing a liner on sidewalls of the first trench, without depositing any liner on sidewalls of the second and third trenches;
  forming, through each of the second trench and the third trench, recesses within the WLs that abut the second and third trenches;
  depositing electrically isolating material within the recesses;
  removing the liner from the sidewalls of the first trench; and
  forming a first pillar in the first trench, a second pillar in the second trench, and a third pillar in the third trench, wherein forming the first, second, and third pillars includes:
    forming the first, second, and third pillars such that each of the first, second, and third pillars comprise (i) a pillar core, (ii) a dielectric layer around at least a section of the pillar core, (iii) a floating gate layer around at least a section of the dielectric layer, and (iv) two or more inter-poly dielectric (IPD) layers around at least a section of the floating gate layer.

20. The method of any of claim 19, wherein:
  the electrically isolating material is deposited along a periphery of the second pillar and the third pillar, thereby isolating the second and third pillars from the plurality of WLs.

* * * * *